(12) United States Patent
Yamada et al.

(10) Patent No.: US 8,338,081 B2
(45) Date of Patent: Dec. 25, 2012

(54) ALKALI-DEVELOPABLE PHOTOSENSITIVE RESIN COMPOSITION AND β-DIKETONE COMPOUND

(75) Inventors: Takashi Yamada, Tokyo (JP); Naomi Sato, Tokyo (JP); Koichi Kimijima, Tokyo (JP)

(73) Assignee: Adeka Corporation, Tokyo (JP)

( * ) Notice: Subject to any disclaimer, the term of this patent is extended or adjusted under 35 U.S.C. 154(b) by 499 days.

(21) Appl. No.: 12/596,098

(22) PCT Filed: Jul. 25, 2008

(86) PCT No.: PCT/JP2008/063423
§ 371 (c)(1), (2), (4) Date: Oct. 15, 2009

(87) PCT Pub. No.: WO2009/017064
PCT Pub. Date: Feb. 5, 2009

(65) Prior Publication Data
US 2010/0129753 A1      May 27, 2010

(30) Foreign Application Priority Data

Aug. 1, 2007 (JP) .................. 2007-201355
Mar. 5, 2008 (JP) .................. 2008-054688
Mar. 31, 2008 (JP) .................. 2008-089070

(51) Int. Cl.
| | |
|---|---|
| G03F 7/027 | (2006.01) |
| C07D 209/82 | (2006.01) |
| C07D 209/86 | (2006.01) |
| C08G 59/17 | (2006.01) |
| C08F 299/02 | (2006.01) |
| C08F 2/46 | (2006.01) |

(52) U.S. Cl. ............... 430/280.1; 430/285.1; 430/286.1; 548/444; 560/205; 560/225

(58) Field of Classification Search .................. None
See application file for complete search history.

(56) References Cited

U.S. PATENT DOCUMENTS

| | | | |
|---|---|---|---|
| 4,024,297 A | 5/1977 | Gruber | |
| 5,459,178 A | 10/1995 | Chan et al. | |
| 6,025,410 A * | 2/2000 | Moy et al. | 522/182 |
| 2003/0195317 A1 | 10/2003 | Lachowicz et al. | |
| 2003/0225180 A1 | 12/2003 | Gaudl et al. | |
| 2004/0063026 A1 * | 4/2004 | Barr et al. | 430/270.1 |
| 2004/0063030 A1 * | 4/2004 | Barr et al. | 430/270.1 |
| 2004/0115437 A1 * | 6/2004 | Dammann et al. | 428/413 |
| 2005/0080202 A1 * | 4/2005 | Narayan-Sarathy et al. | 525/458 |
| 2005/0256218 A1 | 11/2005 | Lachowicz et al. | |
| 2006/0084715 A1 * | 4/2006 | Fechter et al. | 522/173 |
| 2009/0030106 A1 * | 1/2009 | Jacobine et al. | 522/170 |

FOREIGN PATENT DOCUMENTS

| | | |
|---|---|---|
| CN | 101029018 | 9/2007 |
| GB | 1 571 060 | 7/1980 |
| JP | 2003-212976 | 7/2003 |
| JP | 2003-327610 | 11/2003 |
| JP | 3649331 | 2/2005 |
| JP | 2005-163041 | 6/2005 |
| JP | 2006-241461 | 9/2006 |
| RU | 2296756 | 4/2007 |
| WO | WO 96/12579 | 5/1996 |

OTHER PUBLICATIONS

European Search Report—EP 08 79 1667—Dec. 2, 2011.
International Search Report, PCT/JP2008/063423, Oct. 14, 2008.
First CN Office Action dated Jun. 30, 2011, Application No. 200880012137.1 with English Translation.
D1: Synthesis, Characterization and photoelectric functional study of carbazole diketone complexes, May 2006.

* cited by examiner

*Primary Examiner* — Cynthia Hamilton
(74) *Attorney, Agent, or Firm* — Young & Thompson

(57) ABSTRACT

An alkali developable photosensitive resin composition contains (J) a photopolymerizable unsaturated compound having a structure resulting from the addition reaction of (B) a compound having a β-diketone moiety or a compound having a β-ketoester group to the (meth)acryloyl group of (A) a compound having at least two (meth)acryloyl groups and a hydroxyl group and subsequent esterification of the hydroxyl group of the resulting addition product with (C) a polybasic acid anhydride. The compound having a β-diketone moiety is preferably a novel β-diketone compound represented by general formula (I):

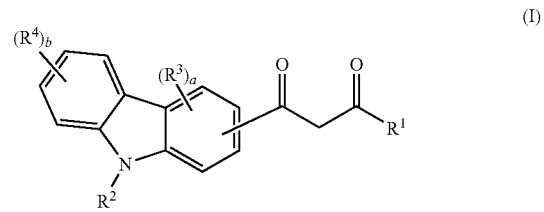

(I)

wherein $R^1$ is a C1-C20 alkyl group; $R^2$ represents $R^{11}$, $OR^{11}$, $COR^{11}$, $SR^{11}$, $CONR^{12}R^{13}$, or CN; $R^{11}$, $R^{12}$, and $R^{13}$ are each hydrogen, a C1-C20 alkyl group, etc.; $a$ is 0 to 3; and $b$ is 0 to 4.

17 Claims, No Drawings

ALKALI-DEVELOPABLE PHOTOSENSITIVE RESIN COMPOSITION AND β-DIKETONE COMPOUND

FIELD OF THE INVENTION

This invention relates to an alkali-developable photosensitive resin composition containing a specific compound having an ethylenically unsaturated bond, which may further contain a photopolymerization initiator, and a noble β-diketone compound having a carbazolyl group that is an intermediate for the preparation of the composition.

BACKGROUND OF THE INVENTION

An alkali developable photosensitive resin composition usually includes an alkali developable photosensitive resin composition precursor containing a compound having an ethylenically unsaturated bond and a photopolymerization initiator. The alkali developable photosensitive resin composition cures through polymerization upon irradiation with ultraviolet light or an electron beam and has applications to photocuring inks, presensitized printing plates, photoresists for the production of printed wiring boards or color filters for liquid crystal displays, and the like. To follow the recent advancement in miniaturization and increased functionality of electronic equipment, an alkali developable photosensitive resin composition capable of forming a fine pattern with high precision has been sought.

Because for one thing the photopolymerization initiator used in the alkali developable photosensitive resin composition is costly and, for another, an unreacted part of, or a decomposition product of, the initiator can remain in a coating film to cause stains, it has been awaited to develop an alkali developable photosensitive resin composition that contains no or a reduced amount of a photopolymerization initiator and is yet excellent in sensitivity and adhesion and capable of forming a fine pattern with good precision.

Patent documents 1 through 4 (see below) teach that a reaction product obtained by the addition of a β-diketone compound to a compound having an acryloyl group is usable as a photocuring composition that cures without the aid of a photopolymerization initiator. However, these documents give no examples of using the reaction product as an alkali developable photosensitive resin composition.

A β-diketone compound is used in catalysts, probes, fluorescent materials, and so forth. A β-diketone compound is also known to form a complex with various metals and has recently come to be an important substance in the field of electronic equipment as a CVD or MOD material or a component of a metal alkoxide-based photosensitive resin composition, and the like.

It is known that an addition product of a (meth)acryloyl group-containing compound and a β-diketone compound exhibits photoinitiating ability. For example, patent documents 1 to 3 describes a β-diketone compound of which the methylene moiety is a quaternary carbon atom photogenerates a free radical on exposure to light and is useful in a photocuring composition. However, the conventional compounds are unable to exhibit sufficient performance unless they are exposed to an increased amount of light.

Patent document 1: Japanese patent 3649331
Patent document 2: JP 2005-163041A
Patent document 3: JP 2006-241461A
Patent document 4: U.S. Pat. No. 5,459,178

SUMMARY OF THE INVENTION

The problem is that there has been no alkali developable photosensitive resin composition that contains no or a reduced amount of a photopolymerization initiator and is yet excellent in sensitivity and adhesion and capable of forming an appropriate pattern profile or a fine pattern.

Accordingly, an object of the invention is to provide a β-diketone compound with a substituent capable of efficient light absorption and an alkali developable photosensitive resin composition that contains no or a reduced amount of a photopolymerization initiator and is yet excellent in sensitivity and adhesion and capable of forming a fine pattern with good precision.

The invention provides an alkali developable photosensitive resin composition characterized by containing (J) a photopolymerizable unsaturated compound having a structure resulting from the addition reaction of (B) a compound having a β-diketone moiety or a compound having a β-ketoester group to the (meth)acryloyl group of (A) a compound having at least two (meth)acryloyl groups and a hydroxyl group and subsequent esterification of the hydroxyl group of the resulting addition product with (C) a polybasic acid anhydride.

In a preferred embodiment of the invention, the compound having a β-diketone moiety is represented by general formula (I):

[Formula 1]

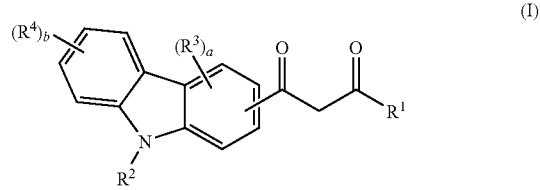

(I)

wherein $R^1$ represents an alkyl group having 1 to 20 carbon atoms; $R^2$ represents $R^{11}$, $OR^{11}$, $COR^{11}$, $SR^{11}$, $CONR^{12}R^{13}$, or CN; $R^{11}$, $R^{12}$, and $R^{13}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms, in which the alkyl group, aryl group, arylalkyl group, and heterocyclic group may have their hydrogen atom substituted with $OR^{21}$, $COR^{21}$, $SR^{21}$, $NR^{22}R^{23}$, $CONR^{22}R^{23}$, $-NR^{22}-OR^{23}$, $-NCOR^{22}-OCOR^{23}$, $-C(=N-OR^{21})-R^{22}$, $-C(=N-OCOR^{21})-R^{22}$, CN, a halogen atom, $-CR^{21}=CR^{22}R^{23}$, $-CO-CR^{21}=CR^{22}R^{23}$, a carboxyl group, or an epoxy group; $R^{21}$, $R^{22}$, and $R^{23}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms; the methylene units of the alkylene moiety of the substituents represented by $R^{11}$, $R^{12}$, $R^{13}$, $R^{21}$, $R^{22}$, and $R^{23}$ may be interrupted by an unsaturated linkage, an ether linkage, a thioether linkage, an ester linkage, a thioester linkage, an amido linkage, or a urethane linkage at 1 to 5 sites thereof; the alkyl moiety of the substituents represented by $R^{11}$, $R^{12}$, $R^{13}$, $R^{21}$, $R^{22}$, and $R^{23}$ may be branched or cyclic; the alkyl terminal of the substituents represented by $R^{11}$, $R^{12}$, $R^{13}$, $R^{21}$, $R^{22}$, and $R^{23}$ may have an unsaturated bond; $R^{12}$ and $R^{13}$, and $R^{22}$ and $R^{23}$ may be connected to each other to form a ring; $R^2$ may be taken together with a neighboring benzene ring to form a ring; $R^3$ and $R^4$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $OCSR^{11}$, $COSR^{11}$, $CSOR^{11}$, CN, a halogen atom, a nitro group, or a hydroxyl group; a represents an integer of 0 to 3; b represents an integer of 0 to 4; when a or b is 2 or greater, $R^3$s or $R^4$s may be the same or different; and the β-diketone moiety may have either a keto-form or an enol-form.

In another preferred embodiment of the invention, the compound (A) having at least two (meth)acryloyl groups and a hydroxyl group has a structure of a reaction product resulting from the addition of (E) an unsaturated monobasic acid to (D) an epoxy compound, particularly an epoxy compound represented by general formula (II):

[Formula 2]

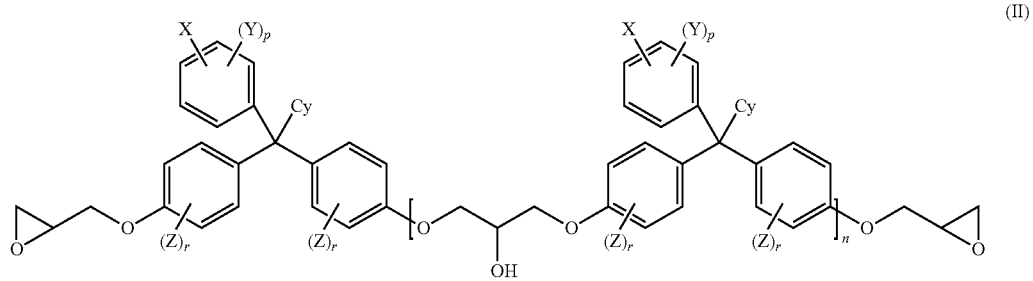

wherein Cy represents a cycloalkyl group having 3 to 10 carbon atoms; X represents a hydrogen atom, a phenyl group, or a cycloalkyl group having 3 to 10 carbon atoms, in which the phenyl group and the cycloalkyl group may be substituted with an alkyl group having 1 to 10 carbon atoms, an alkoxy group having 1 to 10 carbon atoms, or a halogen atom; Y and Z each independently represent an alkyl group having 1 to 10 carbon atoms, an alkoxy group having 1 to 10 carbon atoms, an alkenyl group having 2 to 10 carbon atoms, or a halogen atom, in which the alkyl, alkoxy and alkenyl groups may be substituted with a halogen atom; n represents an integer of 0 to 10; and p and r each independently represent an integer of 0 to 4.

In still another preferred embodiment of the alkali developable photosensitive resin composition, the composition further contains (F) a photopolymerization initiator.

The invention also provides in yet another preferred embodiment a colored alkali developable photosensitive resin composition having the alkali developable photosensitive resin composition of the invention and (G) a colorant.

The invention also provides a β-diketone compound represented by general formula (I).

DETAILED DESCRIPTION OF THE INVENTION

The alkali developable photosensitive resin composition and β-diketone compound of the invention will be described in detail generally with reference to their preferred embodiments.

The description starts with the alkali developable photosensitive resin composition.

The alkali developable photosensitive resin composition of the invention contains (J) a photopolymerizable unsaturated compound having a structure resulting from the addition reaction of (B) a compound having a β-diketone moiety or a compound having a β-ketoester group to the (meth)acryloyl group of (A) a compound having at least two (meth)acryloyl groups and a hydroxyl group and esterification of the hydroxyl group of the resulting addition product with (C) a polybasic acid anhydride.

Examples of the compound (B) having a β-diketone moiety or a β-ketoester group that can be used to obtain the alkali developable photosensitive resin composition include 2,4-pentanedione, 2,4-hexanedione, 2,4-heptanedione, 1-methoxy-2,4-pentanedione, 1-phenyl-1,3-butanedione, 1,3-diphenyl-1,3-propanedione, methyl acetoacetate, ethyl acetoacetate, isopropyl acetoacetate, butyl acetoacetate, t-butyl acetoacetate, 2-methoxyethyl acetoacetate, 2-ethylhexyl acetoacetate, lauryl acetoacetate, allyl acetoacetate, ethyl propionylacetate, butyl propionylacetate, methyl butyrylacetate, methyl benzoylacetate, ethyl benzoylacetate, butyl benzoylacetate, methyl 4,6-dioxoheptanoate, methyl 5,7-dioxooctanoate, 2-acetoacetoxyethyl acrylate, 2-acetoacetoxyethyl methacrylate, benzyl acetoacetate, 1,4-butanediol diacetoacetate, 1,6-hexanediol diacetoacetate, neopentyl glycol diacetoacetate, 2-ethyl-2-butyl-1,3-propanediol diacetoacetate, cyclohexanedimethanol diacetoacetate, ethoxylated bisphenol A diacetoacetate, trimethylolpropane triacetoacetate, glycerol triacetoacetate, pentaerythritol triacetoacetate, pentaerythritol tetraacetoacetate, ditrimethylolpropane tetraacetoacetate, acetoacetic ester group-containing oligomers, interesterification products between ethyl acetoacetate and hydroxyl-containing oligomers or polymers, and acetoacetic ester group-containing oligomers or polymers obtained by the polymerization of 2-acetoacetoxyethyl methacrylate.

The compound having a β-diketone moiety is also exemplified by a β-diketone compound with a carbazoyl group represented by general formula (I) described above. Use of this β-diketone compound is preferred as providing the alkali developable photosensitive resin composition having increased sensitivity.

In general formula (I), examples of the alkyl group having 1 to 20 carbon atoms as represented by $R^1$, $R^{11}$, $R^{12}$, $R^{13}$, $R^{21}$, $R^{22}$, and $R^{23}$ include methyl, ethyl, propyl, isopropyl, butyl, isobutyl, s-butyl, t-butyl, amyl, isoamyl, t-amyl, hexyl, heptyl, octyl, isooctyl, 2-ethylhexyl, t-octyl, nonyl, isononyl, decyl, isodecyl, undecyl, dodecyl, tetradecyl, hexadecyl, octadecyl, eicosyl, cyclopentyl, cyclohexyl, cyclohexylmethyl, vinyl, allyl, butenyl, ethynyl, propynyl, methoxyethyl, ethoxyethyl, propyloxyethyl, pentyloxyethyl, octyloxyethyl, methoxyethoxyethyl, ethoxyethoxyethyl, propoxyethoxyethyl, methoxypropyl, and 2-methoxy-1-methylethoxy. Examples of the aryl group having 6 to 30 carbon atoms as represented by $R^{11}$, $R^{12}$, $R^{13}$, $R^{21}$, $R^{22}$, and $R^{23}$ include phenyl, tolyl, xylyl, ethylphenyl, chlorophenyl, naphthyl, anthryl, phenanthryl, and phenyl, biphenylyl, naphthyl or anthryl substituted with one or more of the above recited alkyl groups. Examples of the arylalkyl group having 7 to 30 carbon atoms as represented by $R^{11}$, $R^{12}$, $R^{13}$, $R^{21}$, $R^{22}$, and $R^{23}$ include benzyl, chlorobenzoyl, α-methylbenzyl, α,α-dimethylbenzyl, phenylethyl, and phenylethenyl. The heterocyclic group having 2 to 20 carbon atoms as represented by $R^{11}$, $R^{12}$, $R^{13}$, $R^{21}$, $R^{22}$, and $R^{23}$ is preferably a 5- to 7-membered heterocyclic ring, such as pyridyl, pyrimidyl, furyl, thienyl, tetrahydrofuryl, dioxolanyl, dimethyldioxolanyl, benzoxazol-2-yl, tetrahydropyranyl, pyrrolidyl, imidazolidyl, pyrazolidyl, thiazolidyl, isothiazolidyl, oxazolidyl, isooxazolidyl, piperidyl, piperazyl, or morpholinyl. Examples of the heterocyclic alkyl group having 3 to 20 carbon atoms include alkyl groups, such as methyl, ethyl, propyl, and butyl, substituted with the above described heterocyclic group having 2 to 20 carbon atoms. Examples of the ring formed by the joining of $R^{12}$ and $R^{13}$, the ring formed by the joining of $R^{22}$ and $R^{23}$, and the ring formed by the joining of $R^{2}$ and a neighboring benzene ring include 5- to 7-membered rings, such as cyclopentane, cyclohexane, cyclopentene, benzene, piperidine, morpholine, lactone, and lactam. Examples of the halogen atom as a substituent on $R^{11}$, $R^{12}$, $R^{13}$, $R^{21}$, $R^{22}$, and $R^{23}$ and as represented by $R^{3}$ and $R^{4}$ include fluorine, chlorine, bromine, and iodine.

Of the β-diketone compounds represented by general formula (I) preferred are those in which $R^{1}$ is a methyl group, and a is 0 for their manufacturing advantages, especially those in which b is 0 or 1, and $R^{4}$ is an optionally halogen-substituted acyl group having 6 to 20 carbon atoms in terms of sensitivity, more especially those in which the acyl group is a benzoyl group optionally substituted with a methyl group or a halogen atom in terms of both sensitivity and manufacturing advantages.

Specific but non-limiting examples of the β-diketone compound represented by general formula (I) having a carbazolyl group include compound Nos. 1 through 10 shown below.

[Formula 3]

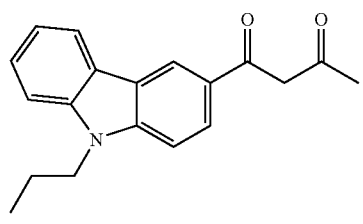

Compound No.1

[Formula 4]

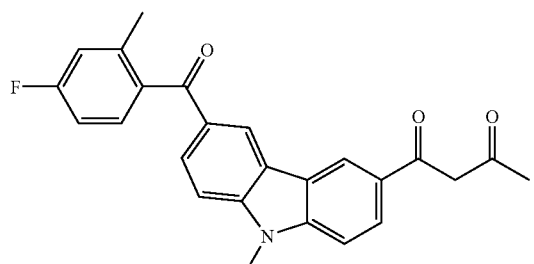

Compound No.2

[Formula 5]

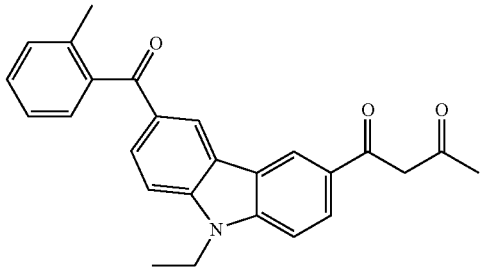

Compound No.3

[Formula 6]

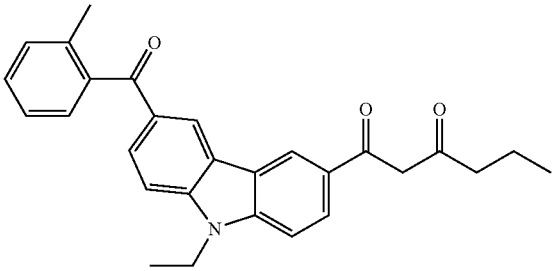

Compound No.4

[Formula 7]

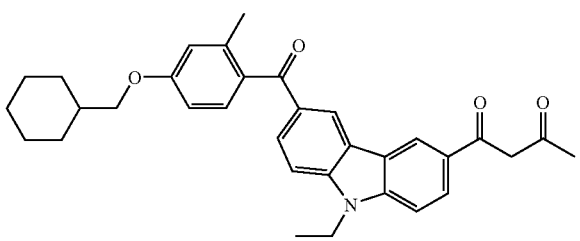

Compound No.5

[Formula 8]

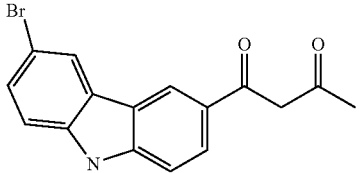

Compound No.6

[Formula 9]

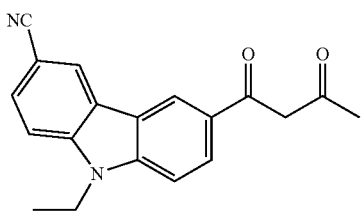

Compound No.7

[Formula 10]

Compound No.8

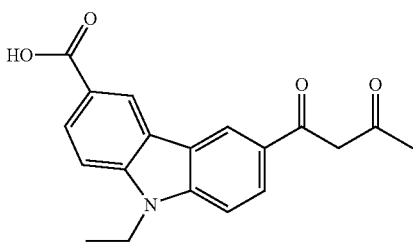

[Formula 11]

Compound No.9

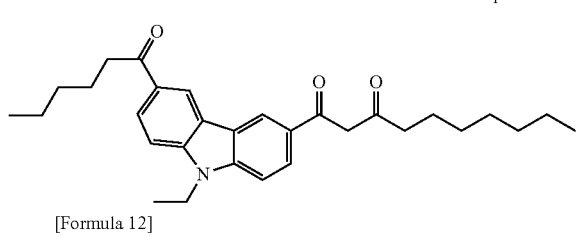

[Formula 12]

Compound No.10

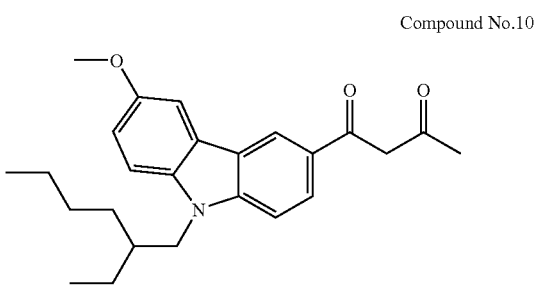

The β-diketone compound represented by general formula (I) is prepared, though not exclusively, by condensation of an acetylcarbazole compound and a carboxylic ester in the presence of a basic catalyst as shown in reaction formula.

[Formula 13]

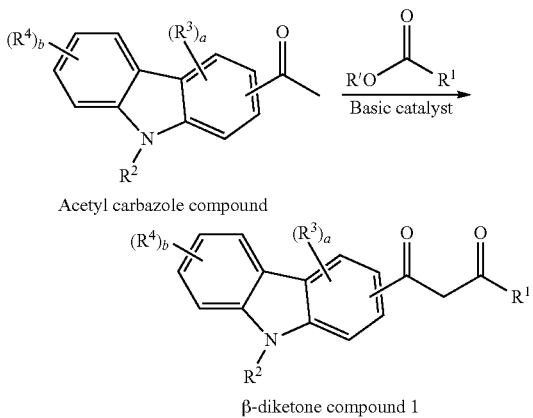

The carboxylic ester is a compound having a corresponding desired substituent $R^1$. Examples of the ester moiety preferably include, but are not limited to, methyl ester, ethyl ester, propyl ester, butyl ester, isoamyl ester, and phenyl ester.

Examples of the basic catalysts include inorganic bases, such as sodium hydroxide, potassium hydroxide, calcium hydroxide, and sodium hydride; metal alkoxides, such as sodium methoxide, sodium ethoxide, lithium diisopropoxide, and potassium t-butoxide; amines, such as diethylamine, triethylamine, 1,4-diazabicyclo[2.2.2]octane, 1,5-diazabicyclo[4,3,0]-5-nonene, and 1,8-diazabicyclo[5.4.0]-7-undecene; metal amides, such as sodium amide and lithium diisopropylamide; and ammonium hydroxide salts, such as tetrabutylammonium hydroxide and benzyltrimethylammonium hydroxide.

In using the β-diketone compound represented by general formula (I), the other compound having a β-diketone moiety described above or the above described compound having a β-ketoester group may be used in combination, if necessary. In this case, the total amount of the other compound having a β-diketone moiety and the compound having a β-ketoester group is not more than equal to the mass of the β-diketone compound represented by general formula (I).

The number of the hydrogen atoms of the methylene group located between the two keto groups of the β-diketone moiety of the compound (B) per (meth)acryloyl group of the compound (A) is preferably 0.1 to 1.0, more preferably 0.3 to 1.0. The number of the acid anhydride structures of the polybasic acid anhydride (C) per hydroxyl group of the addition product is preferably 0.1 to 1.0, more preferably 0.3 to 0.9.

The addition product obtained by the reaction between the compounds (A) and (B) and the photopolymerizable unsaturated compound (J) having a structure resulting from esterification of the hydroxyl group of the addition product with the polybasic acid anhydride (C) may embrace the respective isomers according to the type of addition of the substituted acryloyl group. A mixture of such isomers can be used as such with no problem.

Types of the compound (A) having at least two (meth)acryloyl groups and a hydroxyl group that is used in the invention to prepare the alkali developable photosensitive resin composition include an esterification product between (t-1) or fewer hydroxyl groups of a polyol compound having three to t hydroxyl groups and (E) an unsaturated monobasic acid; an esterification product between (t-1) or fewer hydroxyl groups of a derivative having three to t hydroxyl groups and (E) an unsaturated monobasic acid, the derivative being a polyol and hydroxy acid or alkylene oxide adduct represented by general formula (A-1) below; and an addition product between (D) an epoxy compound and (E) an unsaturated monobasic acid.

$$Z_{11}(OH)_s(-O-CO-L-OH)_t[-(OL)_w-OH]_u \quad (A-1)$$

wherein $Z_{11}$ represents a polyol residue; s, t, and u represent integers amounting to at least 3; L represents an alkanediyl group, such as methylene, ethylene, propylene, trimethylene, butylene, and tetramethylene; and w represents an integer of 1 to 15.

The number of the carboxyl groups of the unsaturated monobasic acid (E) per epoxy group of the epoxy compound (D) is preferably 0.1 to 1.0, more preferably 0.5 to 1.0.

Examples of the compound (A) include pentaerythritol triacrylate, dipentaerythritol pentaacrylate, trimethylolethane diacrylate, trimethylolpropane diacrylate, tetramethylolpropane triacrylate, 2-hydroxy-3-acryloyloxypropyl acrylate, and compound No. 11 shown below.

[Formula 14]

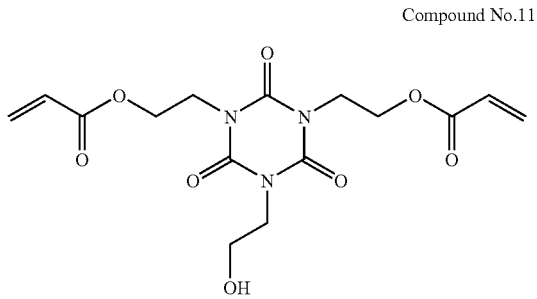

Compound No.11

The number of (meth)acryloyl groups of the compound (A) is preferably 2 to 10, more preferably 2 to 6. The number of hydroxyl groups of the compound (A) is preferably 1 to 8, more preferably 1 to 4. The compound (A) having the stated numbers of (meth)acryloyl groups and of hydroxyl groups provides an alkali developable photosensitive resin composition having good developability and adhesion.

Examples of the epoxy compound (D) include polyfunctional epoxy compounds described below and the compounds having the structure represented by general formula (A-1).

Types of the polyfunctional epoxy compounds include bisphenolic epoxy compounds and glycidyl ethers. The bisphenolic epoxy compounds include alkylidenebisphenol polyglycidyl ether type epoxy resins, such as bisphenol A epoxy compounds, bisphenol F epoxy compounds, and bis(hydroxyphenyl)fluorene epoxy compounds; and hydrogenated bisphenol type epoxy compounds. The glycidyl ethers include ethylene glycol diglycidyl ether, propylene glycol diglycidyl ether, 1,4-butanediol diglycidyl ether, 1,6-hexanediol diglycidyl ether, 1,8-octanediol diglycidyl ether, 1,10-decanediol diglycidyl ether, 2,2-dimethyl-1,3-propanediol diglycidyl ether, diethylene glycol diglycidyl ether, triethylene glycol diglycidyl ether, tetraethylene glycol diglycidyl ether, hexaethylene glycol diglycidyl ether, 1,4-cyclohexanedimethanol diglycidyl ether, 1,1,1-tri(glycidyloxymethyl)propane, 1,1,1-tri(glycidyloxymethyl)ethane, 1,1,1-tri(glycidyloxymethyl)methane, and 1,1,1-tetra(glycidyloxymethyl)methane.

The polyfunctional epoxy compounds also include novolak type epoxy compounds, such as phenol novolak epoxy compounds, o-, m- or p-phenylphenol novolak epoxy compounds, o-, m- or p-cresol novolak epoxy compounds, o-, m- or p-halogenated phenol novolak epoxy compounds, bisphenol A novolak epoxy compounds, bisphenol F novolak epoxy compounds, and naphthol novolak epoxy compounds; novolak type epoxy compounds formed by cocondensation of the stated epoxy compounds or polycondensation of the stated epoxy compounds and aromatic hydrocarbons; epoxy compounds resulting from addition reaction between the stated epoxy compounds and dicyclopentadiene; alicyclic epoxy compounds, such as 3,4-epoxy-6-methylcyclohexylmethyl 3',4'-epoxy-6'-methylcyclohexanecarboxylate, 3,4-epoxycyclohexylmethyl 3',4'-epoxycyclohexanecarboxylate, 2,2-bis(3,4-epoxycyclohexyl)propane, and 1-epoxyethyl-3,4-epoxycyclohexane; glycidyl esters, such as diglycidyl phthalate, diglycidyl tetrahydrophthalate, and glycidyl dimerate; glycidylamines, such as tetraglycidyldiaminodiphenylmethane, triglycidyl-p-aminophenol, and N,N-diglycidylaniline; heterocyclic epoxy compounds, such as 1,3-diglycidyl-5,5-dimethylhydantoin and triglycidyl isocyanurate; dioxide compounds, such as dicyclopentadiene dioxide; naphthalene epoxy compounds, triphenylmethane epoxy compounds, dicyclopentadiene epoxy compounds; and epoxy compounds obtained by glycidyl-etherifying the hydroxyl groups of an addition polymer of o-, m- or p-hydroxystyrene or a copolymer of o-, m- or p-hydroxystyrene and ethylene and/or propylene.

Particularly preferred of these epoxy compounds (D) are those represented by general formula (II) in terms of the good characteristics as an epoxy resin.

In general formula (II), examples of the cycloalkyl group having 3 to 10 carbon atoms as represented by Cy include cyclopropyl, cyclobutyl, cyclopentyl, cyclohexyl, methylcyclohexyl, cycloheptyl, cyclooctyl, cyclononyl, and cyclodecyl.

Examples of the cycloalkyl group having 3 to 10 carbon atoms as represented by X in general formula (II) are the same as those described for Cy. The phenyl group or the C3-C10 cycloalkyl group as X may be substituted with an alkyl group having 1 to 10 carbon atoms, an alkoxy group having 1 to 10 carbon atoms, or a halogen atom. Examples of these substituents include those described below with respect to Y and Z.

Examples of the alkyl group having 1 to 10 carbon atoms as represented by Y and Z include methyl, ethyl, propyl, isopropyl, butyl, isobutyl, s-butyl, t-butyl, amyl, isoamyl, t-amyl, hexyl, heptyl, octyl, isooctyl, t-octyl, 2-ethylhexyl, nonyl, isononyl, decyl, and isodecyl. Examples of the alkoxy group having 1 to 10 carbon atoms as represented by Y and Z include methoxy, ethoxy, propyloxy, butyloxy, methoxyethyl, ethoxyethyl, propoxyethyl, methoxyethoxyethyl, ethoxyethoxyethyl, propyloxyethoxyethyl, and methoxypropyl. Examples of the alkenyl group having 2 to 10 carbon atoms as represented by Y and Z include vinyl, allyl, butenyl, and propenyl. Examples of the halogen atom as represented by Y and Z include fluorine, chlorine, bromine, and iodine.

The alkyl and alkoxy groups with which the phenyl group or C3-C10 cycloalkyl group as X may be substituted and the alkyl, alkoxy, and alkenyl groups as Y and Z may be substituted with a halogen atom. Examples of the halogen atom include fluorine, chlorine, bromine, and iodine. Examples of the C1-C10 alkyl group substituted with a fluorine atom, for instance, are monofluoromethyl, difluoromethyl, trifluoromethyl, trifluoroethyl, and perfluoroethyl.

Specific examples of the epoxy compound (D) of general formula (II) include compound Nos. 12 through 20 below in which n is a number of 0 to 10.

[Formula 15]

Compound No. 12

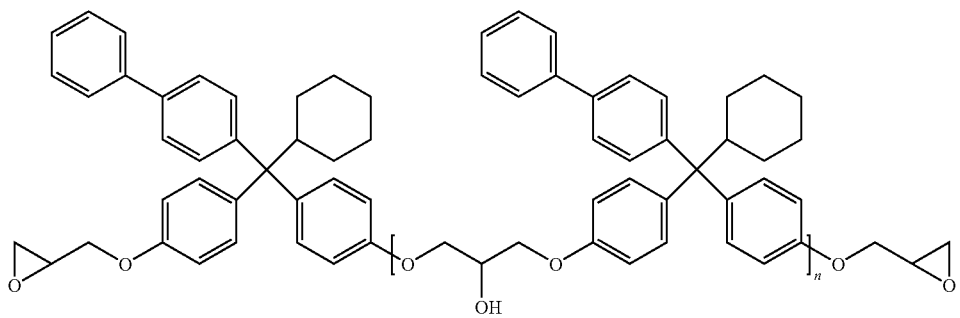

[Formula 16]
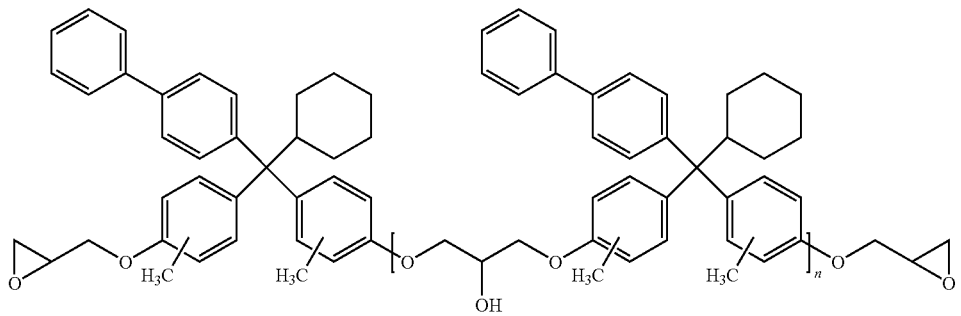
Compound No. 13
wherein the substituent H₃C— may be at any position.
[Formula 17]
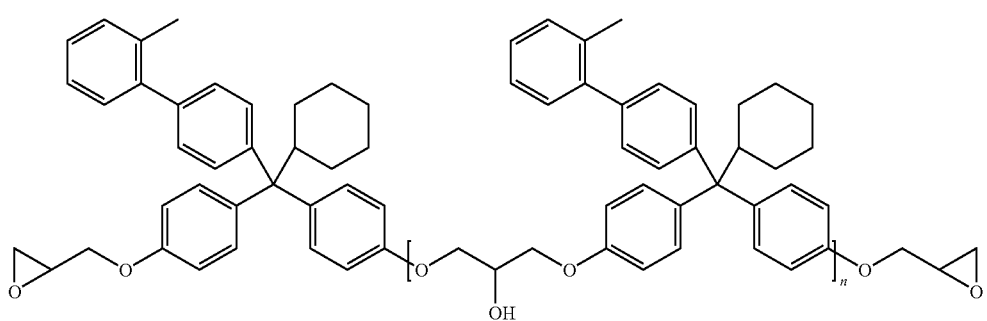
Compound No.14
[Formula 18]
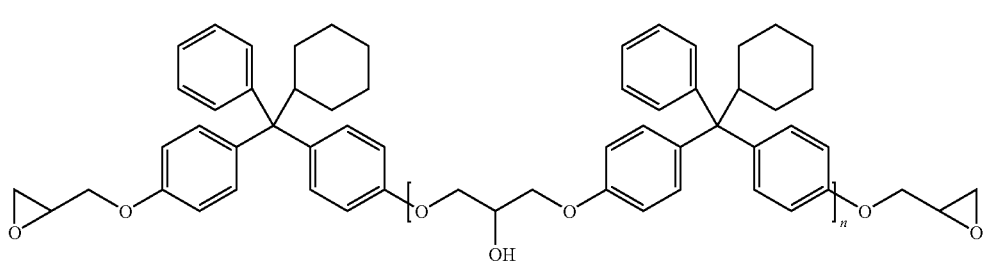
Compound No.15
[Formula 19]
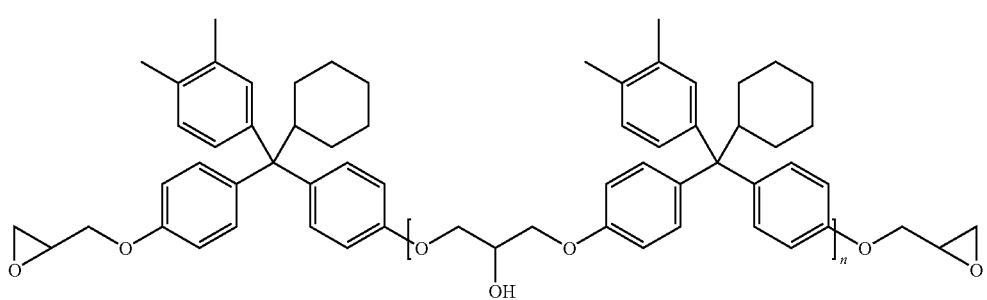
Compound No.16

[Formula 20]

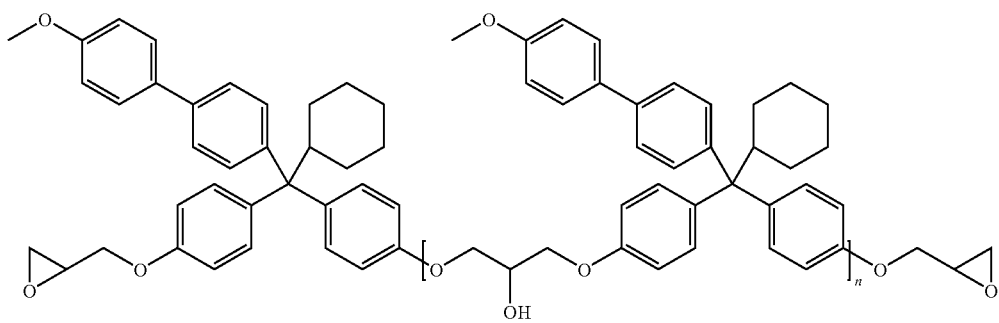

Compound No.17

[Formula 21]

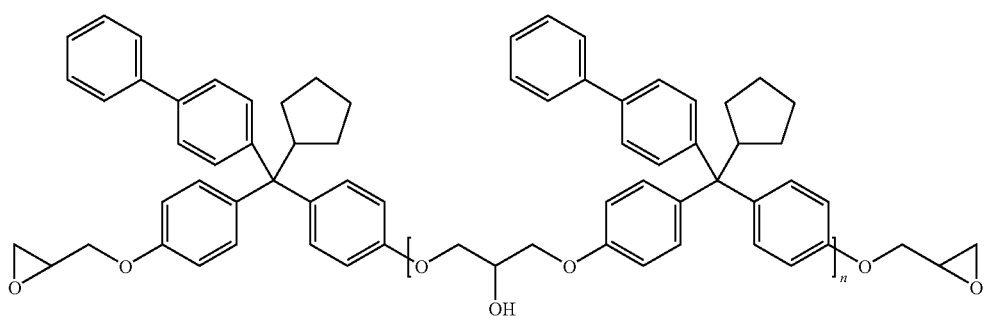

Compound No.18

[Formula 22]

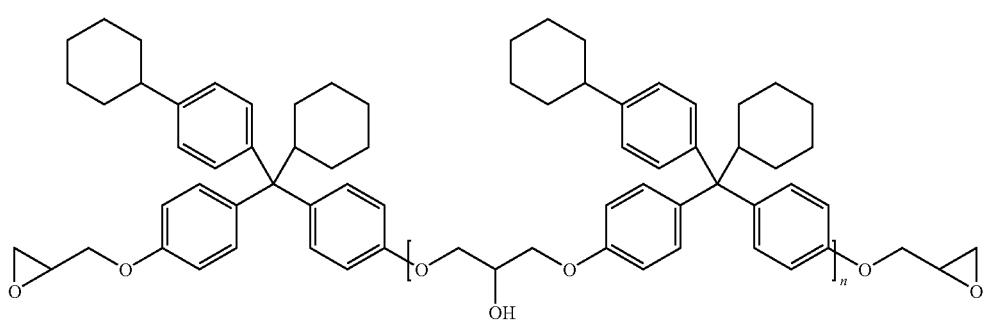

Compound No.19

[Formula 23]

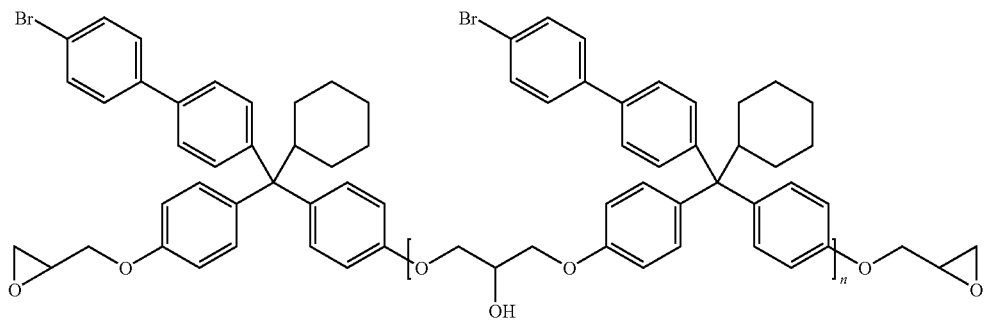

Compound No.20

Of the epoxy compounds (D) of general formula (II) preferred are those in which Cy is a cyclohexyl group, X is a phenyl group, and p and r are 0 because of availability of the starting materials and good productivity.

The epoxy compound (D) of general formula (II) may be prepared by any process. For example, it is obtained with ease in accordance with the reaction scheme below, in which a substituted phenyl cycloalkyl ketone (1) and a phenol derivative are caused to react in the presence of an acid catalyst to form a bisphenol compound (2), which is then caused to react with epichlorohydrin in the presence of an alkali, a Lewis acid, or a phase transfer catalyst.

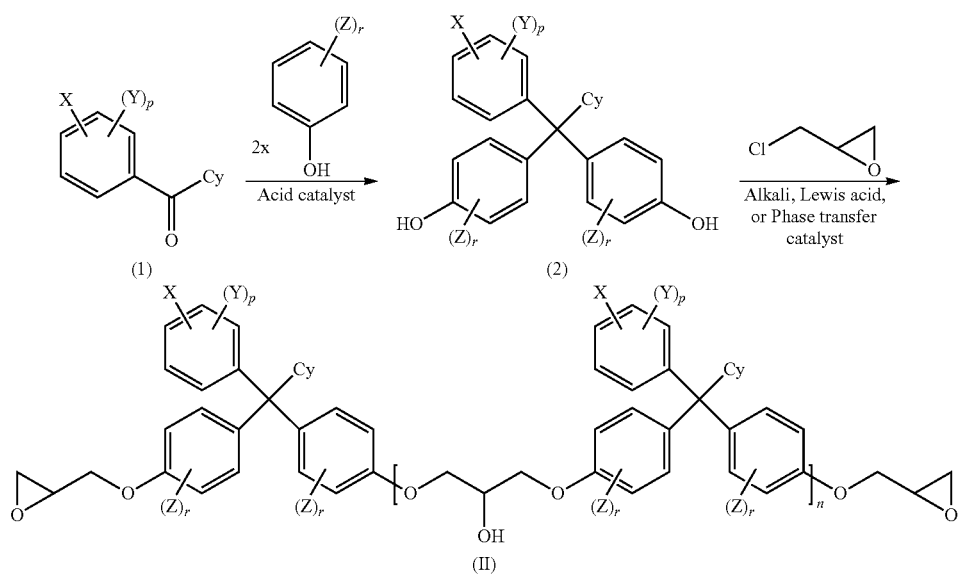

[Formula 24]

The bisphenol compound (2) is prepared under known reaction conditions. For example, the reaction is carried out in the presence of an acid catalyst at a temperature of 20° to 200° C. for a period of 1 to 40 hours.

Examples of the acid catalyst include sulfonic acids, such as methanesulfonic acid, benzenesulfonic acid, m-xylenesulfonic acid, p-toluenesulfonic acid, hydroxymethylsulfonic acid, 2-hydroxyethylsulfonic acid, hydroxypropylsulfonic acid, trifluoromethanesulfonic acid, sulfosalicylic acid, and sulfophthalic acid; sulfuric acid, sulfuric anhydride, fuming sulfuric acid, chlorosulfuric acid, fluorosulfuric acid, hydrochloric acid, hydrogen chloride gas, oxalic acid, formic acid, phosphoric acid, trichloroacetic acid, trifluoroacetic acid; heteropoly acids, such as silicotungstic acid and phosphotungstic acid; strongly acidic ion exchange resins, activated white earth, boron trifluoride, anhydrous aluminum chloride, and zinc chloride. The acid catalyst is used preferably in an amount of 0.1 to 70 parts, more preferably 40 to 80 parts, by mass per 100 parts by mass of the substituted phenyl cycloalkyl ketone (1).

A mercaptan catalyst may be used to accelerate the reaction. Useful mercaptan catalysts include alkylmercaptans, such as methylmercaptan, ethylmercaptan, propylmercaptan, butylmercaptan, octylmercaptan, dodecylmercaptan, and 1,6-hexanedithiol; aromatic mercaptans, such as thiophenol and thiocresol; mercapto-organic acids, such as mercaptoacetic acid (or thioglycolid acid), 3-mercaptopropionic acid, mercaptoundecanoic acid, and thiobenzoic acid; and heterocyclic mercaptans, such as 2-mercaptobenzothiazole.

The reaction may be carried out using a conventional solvent. Examples of suitable solvents include aromatic hydrocarbon solvents, such as toluene, xylene, and cumene; terpene hydrocarbon oils, such as turpentine, D-limonene, and pinene; paraffinic solvents, such as mineral spirit, Swasol #310 (from Cosmo Matsuyama Oil Co., Ltd.) and Solvesso #100 (from Exxon Chemicals); alcohol solvents, such as methanol and ethanol; ester solvents, such as ethyl acetate; halogen solvents, such as dichloroethane, carbon tetrachloride, chloroform, trichloroethylene, methylene chloride, and chlorobenzene; cyclic ether solvents, such as tetrahydrofuran and dioxane; ethers, cellosolve solvents, ketone solvents, aniline, triethylamine, pyridine, dioxane, acetic acid, acetonitrile, and carbon disulfide.

The epoxy compound (D) of formula (II) is prepared from the bisphenol compound (2) and epichlorohydrin under known conditions. For example, the reaction is carried out in the presence of an alkali, a Lewis acid, or a phase transfer catalyst at 20° to 100° C., preferably 30° to 80° C. At temperatures lower than 20° C., the reaction rate is reduced so that an extended reaction time will be needed. At temperatures higher than 100° C., unfavorable side reactions will increase.

Examples of the alkali for use in the reaction include sodium hydroxide, potassium hydroxide, and calcium hydroxide. Examples of the Lewis acid include the above described acid catalysts, tin tetrachloride, boron trifluoride, titanium tetrachloride, activated white earth, aluminum chloride, magnesium chloride, potassium permanganate, and potassium chromate. Examples of the phase transfer catalysts include tetramethylammonium chloride, tetrabutylammonium bromide, methyltrioctylammonium chloride, methyltridecylammonium chloride, benzyltriethylammonium chloride, N,N-dimethylpyrrolidinium chloride, N-ethyl-N-methylpyrrolidinium iodide, N-butyl-N-methylpyrrolidinium bromide, N-benzyl-N-methylpyrrolidinium chloride, N-ethyl-N-methylpyrrolidinium bromide, N-butyl-N-methylmorpholinium bromide, N-butyl-N-methylmorpholinium iodide, N-allyl-N-methylmorpholinium bromide, N-methyl-N-benzylpiperidinium chloride, N-methyl-N-benzylpiperidinium bromide, N,N-dimethylpiperidinium iodide, N-methyl-N-ethylpiperidinium acetate, and N-methyl-N-ethylpiperidinium iodide.

The amount of epichlorohydrin to be used in the reaction is at least one mol, preferably 2 to 10 mol, per hydroxyl group of the bisphenol compound (2). The amount of the alkali to be used is 0.1 to 2.0 mol, preferably 0.3 to 1.5 mol, per hydroxyl group of the bisphenol compound (2). The amount of the Lewis acid or phase transfer catalyst to be used is 0.01 to 10 mol %, preferably 0.2 to 5 mol %, per hydroxyl group of the bisphenol compound (2).

The reaction may be carried out using a solvent such as described with reference to the preparation of the bisphenol compound (2). The epichlorohydrin may be used in excess to serve as a solvent.

The unsaturated monobasic acid (E) that may be used to obtain the alkali developable photosensitive resin composition of the invention is used to increase the sensitivity of the alkali developable photosensitive resin composition. Examples of the unsaturated monobasic acid (E) include acrylic acid, methacrylic acid, crotonic acid, cinnamic acid, sorbic acid, hydroxyethyl methacrylate maleate, hydroxyethyl acrylate maleate, hydroxypropyl methacrylate maleate, hydroxypropyl acrylate maleate, dicyclopentadiene maleate, and a polyfunctional (meth)acrylate having one carboxyl group and at least two (meth)acryloyl groups.

The polyfunctional (meth)acrylate having one carboxyl group and at least two (meth)acryloyl groups is obtainable by, for example, the reaction between a polyfunctional (meth)acrylate having one hydroxyl group and at least two (meth)acryloyl groups per molecule and a dibasic acid anhydride or a carboxylic acid.

Specific examples of the polyfunctional (meth)acrylate having one carboxyl group and at least two (meth)acryloyl groups are compound Nos. 21 to 23 below.

[Formula 25]

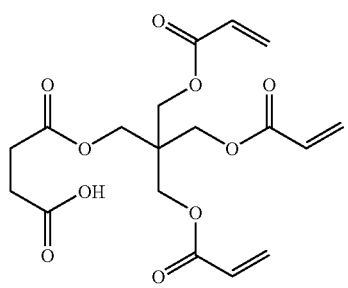

Compound No.21

[Formula 26]

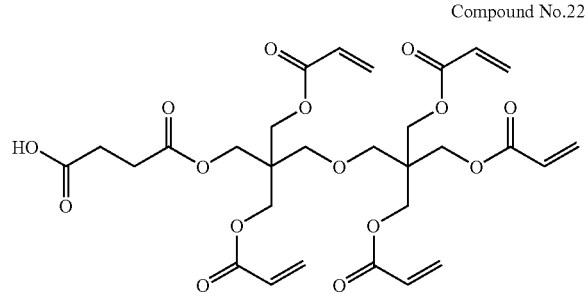

Compound No.22

[Formula 27]

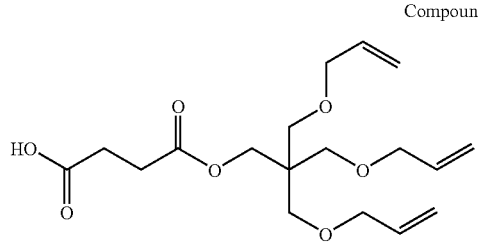

Compound No.23

Examples of the polybasic acid anhydride (C) that can be used to obtain the alkali developable photosensitive resin composition include monohydrides, such as succinic anhydride, maleic anhydride, trimellitic anhydride, phthalic anhydride, methyltetrahydrophthalic anhydride, tetrahydrophthalic anhydride, nadic anhydride, methylnadic anhydride, trialkyltetrahydrophthalic anhydrides, hexahydrophthalic anhydride, methylhexahydrophthalic anhydride, dodecenylsuccinic anhydride, and methylhymic anhydride; dianhydrides, such as 3,3',4,4'-biphenyltetracarboxylic acid dianhydride, pyromellitic anhydride, 3,3',4,4'-benzophenonetetracarboxylic acid anhydride, ethylene glycol bis(anhydrotrimellitate), 2,2',3,3'-benzophenonetetracarboxylic acid anhydride, 3,3',4,4'-diphenyltetrasulfonic acid dianhydride, 4,4'-oxydiphthalic dianhydride, 2,3,5-tricarboxycyclopentylacetic dianhydride, 5-(2,5-dioxotetrahydrofuryl)-3-methyl-3-cyclohexene-1,2-dicarboxylic acid anhydride, 1,2,3,4-cyclopentanetetracarboxylic acid dianhydride, trialkyltetrahydrophthalic anhydride-maleic anhydride adducts, and meso-butane-1,2,3,4-tetracarboxylic acid anhydride; and trianhydrides, such as glycerol tris(anhydrotrimellitate). A dianhydride and a monoanhydride may be used in combination. Preferred of them are monoanhydrides.

In the addition reaction of the compound (B) having a β-diketone moiety or a β-ketoester group to the compound (A) having at least two (meth)acryloyl groups and a hydroxyl group, while the compound (A) having at least two (meth)acryloyl groups and a hydroxyl group is an essential component, a compound (A') having a (meth)acryloyl group but no hydroxyl group may be used in combination in an amount that does not ruin the effects of the invention, specifically in an amount of not more than 500 parts by mass per 100 parts by mass of the compound (A). The content of the photopolymerizable unsaturated compound (J), which is obtained by esterifying the resulting addition product with the polybasic acid anhydride (C), in the alkali developable photosensitive resin composition is preferably 1% to 70%, more preferably 20% to 60%, by mass. The solids content of the composition preferably has an acid value of 20 to 100 mg·KOH/g, more preferably 50 to 100 mg·KOH/g.

Examples of the compound (A') having a methacryloyl group but no hydroxyl group include pentaerythritol tetraacrylate, trimethylolpropane triacrylate, tricyclodecanedimethanol diacrylate, dipentaerythritol hexaacrylate, ditrimethylolpropane tetraacrylate, isocyanuric acid EO-modified triacrylate, bisphenol A EO-modified diacrylate, bisphenol F EO-modified diacrylate, tripropylene glycol diacrylate, polypropylene glycol diacrylate, and trimethylolpropane PO-modified triacrylate.

The alkali developable photosensitive resin composition may further contain a solvent in addition to the photopolymerizable unsaturated compound (J). When the content of the photopolymerizable unsaturated compound (J) in the composition is in the preferred range recited above, the balance of the composition may be a solvent. Examples of useful solvents will be described later. The solvent used in the synthesis of the photopolymerizable unsaturated compound (J) from the components (A) to (E) may serve as a solvent of the composition as such. Each of the components (A) to (E) may be a single compound or a mixture of two or more compounds.

The alkali developable photosensitive resin composition works alone with no aid of a photopolymerization initiator, but it may be mixed with a photopolymerization initiator (F) as well as a solvent to provide an alkali developable photosensitive resin composition having enhanced sensitivity.

In the cases where the alkali developable photosensitive resin composition contains the photopolymerization initiator (F), the content of the photopolymerizable unsaturated compound (J) is preferably 30% to 90%, more preferably 40% to 80%, by mass based on the total mass of the solids content excluding the solvent.

Any known compounds may be used as the photopolymerization initiator (F), such as benzoyl peroxide, 2,2'-azobisisobutyronitrile, benzophenone, phenyl biphenyl ketone, 1-hydroxy-1-benzoylcyclohexane, benzil, benzyl dimethyl ketal, 1-benzyl-1-dimethylamino-1-(4'-morpholinobenzoyl) propane, 2-morpholyl-2-(4'-methylmercapto)benzoylpropane, thioxanthone, 1-chloro-4-propoxythioxanthone, isopropylthioxanthone, diethylthioxanthone, ethylanthraquinone, 4-benzoyl-4'-methyldiphenyl sulfide, benzoin butyl ether, 2-hydroxy-2-benzoylpropane, 2-hydroxy-2-(4'-isopropyl)benzoylpropane, 4-butylbenzoyltrichloromethane, 4-phenoxybenzoyldichloromethane, methyl benzoylformate, 1,7-bis(9'-acrydinyl)heptane, 9-n-butyl-3,6-bis(2'-morpholinoisobutyroyl)carbazole, 2-methyl-1-[4-(methylthio)phenyl]-2-morpholinopropan-1-one, p-methoxyphenyl-2,4-bis(trichloromethyl)-s-triazine, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine, 2-(p-butoxystyryl)-s-triazine, 2-(p-butoxystyryl)-5-trichloromethyl-1,3,4-oxadiazole, 9-phenylacridine, 9,10-dimethylbenzphenazine, benzophenone/Michler's ketone, hexaarylbiimidazole/mercaptobenzimidazole, thioxanthone/amine, bis(2,4,6-trimethylbenzoyl)-phenylphosphine oxide, and compounds described in JP 2000-80068A, JP 2001-233842A, JP 2005-97141A, JP 2006-516246A, Japanese Patents 3860170 and 3798008, and WO2006/018973. Preferred of them are compound represented by general formulae (a) or (c):

[Formula 28]

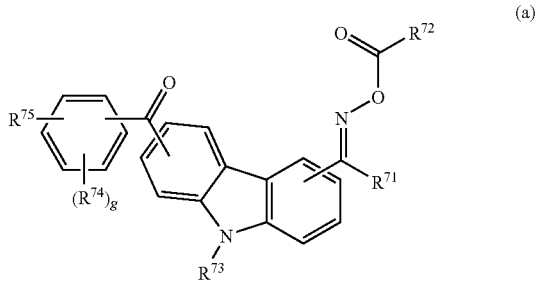

(a)

wherein $R^{71}$, $R^{72}$, and $R^{73}$ each independently represent R, OR, COR, SR, CONRR', or CN; R and R' each independently represent an alkyl group, an aryl group, an arylalkyl group, or a heterocyclic group, each of which may be substituted with a halogen atom and/or a heterocyclic group, and the alkylene moiety of the alkyl or arylalkyl group may be interrupted by an unsaturated bond, an ether linkage, a thioether linkage or an ester linkage; or R and R' may be taken together to form a ring; $R^{74}$ represents a halogen atom or an alkyl group; $R^{75}$ represents a hydrogen atom, a halogen atom, an alkyl group, or a substituent represented by general formula (b) below; and g represents an integer of from 0 to 4; when g is 2 or greater, $R^{74}$s may be the same or different.

[Formula 29]

(b)

wherein ring M represents a cycloalkane ring, an aromatic ring, or a heterocyclic ring; $X^{73}$ represents a halogen atom or an alkyl group; $Y^{71}$ represents an oxygen atom, a sulfur atom, or a selenium atom; $Z^{71}$ represents an alkylene group having 1 to 5 carbon atoms; and h represents an integer of 0 to 4; when h is 2 or greater, $X^{73}$s may be the same or different.

[Formula 30]

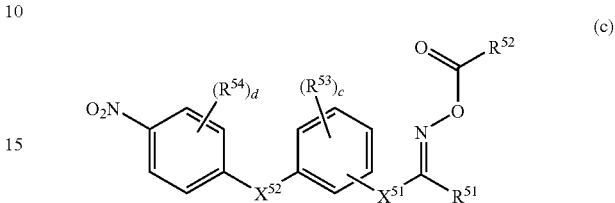

(c)

wherein $R^{51}$ and $R^{52}$ each independently represent $R^{61}$, $OR^{61}$, $COR^{61}$, $SR^{61}$, $CONR^{62}R^{63}$, or CN; $R^{61}$, $R^{62}$, and $R^{63}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms, the alkyl, aryl, arylalkyl, and heterocyclic groups may have their hydrogen atom substituted with $OR^{81}$, $COR^{81}$, $SR^{81}$, $NR^{82}R^{83}$, $CONR^{82}R^{83}$, $—NR^{82}—OR^{83}$, $—NCOR^{82}—OCOR^{83}$, $—C(=N—OR^{81})—R^{82}$, $—C(=N—OCOR^{81})—R^{82}$, CN, a halogen atom, $—CR^{81}=CR^{82}R^{83}$, $—CO—CR^{81}=CR^{82}R^{83}$, a carboxyl group, or an epoxy group; $R^{81}$, $R^{82}$, and $R^{83}$ each represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms; the methylene units of the alkylene moiety of the substituents represented by $R^{61}$, $R^{62}$, $R^{63}$, $R^{81}$, $R^{82}$, and $R^{83}$ may be interrupted by an unsaturated bond, an ether linkage, a thioether linkage, an ester linkage, a thioester linkage, an amido linkage, or a urethane linkage at 1 to 5 sites thereof; the alkyl moiety of the substituents represented by $R^{61}$, $R^{62}$, $R^{63}$, $R^{81}$, $R^{82}$, and $R^{83}$ may be branched or cyclic; the alkyl terminal of the substituents represented by $R^{61}$, $R^{62}$, $R^{63}$, $R^{81}$, $R^{82}$, and $R^{83}$ may have an unsaturated bond; $R^{62}$ and $R^{63}$, and $R^{82}$ and $R^{83}$ may be connected to each other to form a ring; $R^{53}$ and $R^{54}$ each represent $R^{61}$, $OR^{61}$, $SR^{61}$, $COR^{61}$, $CONR^{62}R^{63}$, $NR^{62}COR^{61}$, $OCOR^{61}$, $COOR^{61}$, $SCOR^{61}$, $OCSR^{61}$, $COSR^{61}$, $CSOR^{61}$, CN, a halogen atom, or a hydroxyl group; and c and d each represent an integer 0 to 4; $X^{51}$ represents a direct bond or CO; $X^{52}$ represents an oxygen atom, a sulfur atom, a selenium atom, $CR^{91}R^{92}$, CO, $NR^{93}$, or $PR^{94}$; $R^{91}$, $R^{92}$, $R^{93}$, and $R^{94}$ each independently represent $R^{61}$, $OR^{61}$, $COR^{61}$, $SR^{61}$, $CONR^{62}R^{63}$, or CN; $R^{53}$ may be taken together with one of the carbon atoms of the benzene rings linked via $—X^{52}—$, or $R^{53}$ and $R^{54}$ may be taken together with each other to form a ring; and $R^{91}$, $R^{93}$, and $R^{94}$ may independently be taken together with either of the neighboring benzene rings.

The content of the photopolymerization initiator (F) in the alkali developable photosensitive resin composition is preferably 0.01% to 20%, more preferably 0.05% to 20%, by mass relative to the total mass of the solids content excluding the solvent of the composition. The photopolymerization initiator (F) may be a single compound or a mixture of two or more compounds.

Any solvent capable of dissolving or dispersing each of the above mentioned components may be used in the alkali developable photosensitive resin composition. Examples of such solvents include ketones, such as methyl ethyl ketone, methyl amyl ketone, diethyl ketone, acetone, methyl isopropyl ketone, methyl isobutyl ketone, and cyclohexanone; ether solvents, such as ethyl ether, dioxane, tetrahydrofuran, 1,2-dimethoxyethane, 1,2-diethoxyethane, and dipropylene glycol dimethyl ether; ester solvents, such as methyl acetate, ethyl acetate, n-propyl acetate, isopropyl acetate, and n-butyl acetate; cellosolve solvents, such as ethylene glycol monomethyl ether, ethylene glycol monoethyl ether, and propylene glycol monomethyl ether acetate; alcohol solvents, such as methanol, ethanol, isopropyl alcohol, n-propanol, iso- or n-butanol, and amyl alcohol; BTX solvents (benzene, toluene, xylene, etc.); aliphatic hydrocarbon solvents, such as hexane, heptane, octane, and cyclohexane; terpene hydrocarbon oils, such as turpentine, D-limonene, and pinene; paraffinic solvents, such as mineral spirit, Swasol #310 (from Cosmo Matsuyama Oil Co., ltd.), and Solvesso #100 (from Exxon Chemicals); halogenated aliphatic hydrocarbon solvents, such as carbon tetrachloride, chloroform, trichloroethylene, and methylene chloride; halogenated aromatic hydrocarbon solvents, such as chlorobenzene; carbitol solvents, aniline, triethylamine, pyridine, acetic acid, acetonitrile, carbon disulfide, N,N-dimethylformamide, N-methylpyrrolidone, dimethyl sulfoxide, and water. Preferred of them are ketones and cellosolve solvents. These solvents may be used either individually or as a mixture of two or more thereof.

The amount of the solvent in the alkali developable photosensitive resin composition is preferably adjusted to result in a total solids concentration of 5% to 40%, more preferably 10% to 30%, by mass.

The colored alkali developable photosensitive resin composition of the invention is the above described alkali developable photosensitive resin composition which further contains a colorant (G). Pigments, dyes, naturally occurring dyes, and the like are used as a colorant. The colorants may be used either individually or as a mixture of two or more thereof.

Any of known pigments used in the manufacture of conventional color filters can be used as the colorant. The following is a list of useful organic pigments expressed by C.I. number, in which "x" is an optional integer chosen from C.I. numbers.
Pigment Blue:
C.I. PB 1, 1:2, 1:x, 9:x, 15, 15:1, 15:2, 15:3, 15:4, 15:5, 15:6, 16, 24, 24:x, 56, 60, 61, 62
Pigment Green:
C.I. PG 1, 1:x, 2, 2:x, 4, 7, 10, 36
Pigment Orange:
C.I. PO 2, 5, 13, 16, 17:1, 31, 34, 36, 38, 43, 46, 48, 49, 51, 52, 59, 60, 61, 62, 64
Pigment Red:
C.I. PR 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:3, 81:x, 83, 88, 90, 112, 119, 122, 123, 144, 146, 149, 166, 168, 169, 170, 171, 172, 175, 176, 177, 178, 179, 184, 185, 187, 188, 190, 200, 202, 206, 207, 208, 209, 210, 216, 224, 226
Pigment Violet:
C.I. PV 1, 1:x, 3, 3:3, 3:x, 5:1, 19, 23, 27, 32, 42
Pigment Yellow:
C.I. PY 1, 3, 12, 13, 14, 16, 17, 24, 55, 60, 65, 73, 74, 81, 83, 93, 95, 97, 98, 100, 101, 104, 106, 108, 109, 110, 113, 114, 116, 117, 119, 120, 126, 127, 128, 129, 138, 139, 150, 151, 152, 153, 154, 156, 175

Examples of useful black pigments are: Carbon Black #2400, #2350, #2300, #2200, #1000, #980, #970, #960, #950, #900, #850, MCF88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, $CF_9$, #3050, #3150, #3250, #3750, #3950, Dia Black A, Dia Black N220M, Dia Black N234, Dia Black I, Dia Black LI, Dia Black LH, Dia Black N339, Dia Black SH, Dia Black SHA, Dia Black H, Dia Black HA, Dia Black SF, Dia Black N550M, Dia Black E, Dia Black G, Dia Black R, Dia Black N760M, and Dia Black LR (all from Mitsubishi Chemical Corp.); Carbon Black Thermax series N990, N991, N907, N908, N990, N991, and N908 (all from Cancarb Ltd.); Carbon Black ASAHI #80, ASAHI #70, ASAHI #70L, ASAHI F-200, ASAHI #66, ASAHI #66U, ASAHI #50, ASAHI #35, ASAHI #15, and ASAHI Thermal (all from Asahi Carbon Co., Ltd.); and Color Black Fw200, Color Black Fw2, Color Black Fw2V, Color Black Fw1, Color Black Fw18, Color Black S170, Color Black S160, Special Black 6, Special Black 5, Special Black 4, Special Black 4A, Special Black 250, Special Black 350, Printex U, Printex V, Printex 140U, and Printex 140V (trade names, all from Degussa).

Other organic or inorganic pigments that can be used include nitroso compounds, nitro compounds, azo compounds, diazo compounds, xanthene compounds, quinoline compounds, anthraquinone compounds, coumarin compounds, phthalocyanine compounds, isoindolinone compounds, isoindoline compounds, quinacridone compounds, anthanthrone compounds, perynone compounds, perylene compounds, diketopyrrolopyrrole compounds, thioindigo compounds, dioxazine compounds, triphenylmethane compounds, quinophthalone compounds, and naphthalenetetracarboxylic acids; metal complex compounds of azo dyes or cyanine dyes; lake pigments; carbon black species, such as furnace black, channel black, thermal black, acetylene black, Ketjen black, and lamp black; the carbon blacks recited which have been surface treated with an acid or an alkali; graphite, graphitized carbon black, activated carbon, carbon fiber, carbon nanotube, carbon microcoil, carbon nanohorn, carbon aerogel, fullerene; aniline black, pigment black 7, titanium black; hydrophobic resins, chromium oxide green, Milori blue, cobalt green, cobalt blue, manganese compounds, ferrocyanides, phosphate ultramarine blue, Prussian blue, ultramarine, cerulean blue, viridian, emerald green, lead sulfate, lead yellow, zinc yellow, Bengal red (red iron (III) oxide), cadmium red, synthetic iron black, amber, iron oxide, titanium oxide, calcium carbonate, magnesium carbonate, silica, alumina, cobalt compounds, talc, chromates, various metal sulfates, sulfides, and selenides. These pigments may be used either individually or as a mixture thereof.

The dyes useful as the colorant (G) include azo dyes, anthraquinone dyes, indigoid dyes, triarylmethane dyes, xanthene dyes, alizarine dyes, acridine dyes, stilbene dyes, thiazole dyes, naphthol dyes, quinoline dyes, nitro dyes, indamine dyes, oxazine dyes, phthalocyanine dyes, and cyanine dyes. These dyes can be used either individually or as a mixture of two or more thereof.

The amount of the colorant in the colored alkali developable photosensitive resin composition is preferably 0.5% to 70% by mass, more preferably 5% to 60% by mass, based on the total solids content of the composition excluding the solvent.

The alkali developable photosensitive resin composition may further contain a monomer having an unsaturated bond, a chain transfer agent, a surfactant, and so forth.

Examples of the monomer having an unsaturated bond include 2-hydroxyethyl acrylate, 2-hydroxypropyl acrylate, isobutyl acrylate, n-octyl acrylate, isooctyl acrylate, isononyl acrylate, stearyl acrylate, methoxyethyl acrylate, dimethylaminoethyl acrylate, zinc acrylate, 1,6-hexanediol diacrylate, trimethylolpropane triacrylate, 2-hydroxyethyl methacrylate, 2-hydroxypropyl methacrylate, butyl methacrylate, t-butyl methacrylate, cyclohexyl methacrylate, trimethylolpropane trimethacrylate, dipentaerythritol pentaacrylate, dipentaerythritol hexaacrylate, pentaerythritol tetraacrylate, pentaerythritol triacrylate, and tricyclodecanedimethylol diacrylate.

The content of the monomer having an unsaturated bond in the alkali-developable photosensitive resin composition is preferably 0.01% to 50% by mass, more preferably 10% to 40% by mass, based on the total solids content excluding the solvent. The monomers having an unsaturated bond may be used either individually or as a mixture of two or more thereof.

Examples of the chain transfer agent include mercapto compounds, such as thioglycolic acid, thiomalic acid, thiosalicylic acid, 2-mercaptopropionic acid, 3-mercaptopropionic acid, 3-mercaptobutyric acid, N-(2-mercaptopropionyl)glycine, 2-mercaptonicotinic acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, dodecyl (4-methylthio) phenyl ether, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, 2-mercaptobenzothiazole, mercaptoacetic acid, trimethylolpropane tris(3-mercaptopropionate), and pentaerythritol tetrakis(3-mercaptopropionate); disulfide compounds obtained by oxidizing the recited mercapto compounds; and iodized alkyl compounds, such as iodoacetic acid, iodopropionic acid, 2-iodoethanol, 2-iodoethanesulfonic acid, and 3-iodopropanesulfonic acid. They may be used either individually or as a mixture of two or more thereof.

Examples of the surfactant that can be used include fluorine-containing surfactants, such as perfluoroalkylphosphoric esters and perfluoroalkylcarboxylic acid salts; anionic surfactants, such as higher fatty acid alkali salts, alkylsulfonates, and alkylsulfates; cationic surfactants, such as higher amine halogenic acid salts and quaternary ammonium salts; nonionic surfactants, such as polyethylene glycol alkyl ethers, polyethylene glycol fatty acid esters, sorbitan fatty acid esters, and fatty acid monoglycerides; amphoteric surfactants; and silicone surfactants. These surface active agents can be used either individually or as a combination thereof.

The alkali-developable photosensitive resin composition of the invention, either colored or non-colored, may further contain a thermoplastic organic polymer to improve the characteristics of its cured product. Examples of the thermoplastic organic polymer include polystyrene, polymethyl methacrylate, a methyl methacrylate-ethyl acrylate copolymer, poly (meth)acrylic acid, a styrene-(meth)acrylic acid copolymer, a (meth)acrylic acid-methyl methacrylate copolymer, polyvinyl butyral, cellulose esters, polyacrylamides, and saturated polyesters. These polymers may be used either individually or as a mixture of two or more thereof.

If desired, the alkali-developable photosensitive resin composition, either colored or non-colored, may contain commonly employed additives, such as a thermal polymerization suppressor, such as anisole, hydroquinone, pyrocatechol, tert-butyl catechol, and phenothiazine, a plasticizer, an adhesion accelerator, a filler, a defoaming agent, a dispersant, a leveling agent, a silane coupling agent, and a flame retardant. They may be used either individually or as a mixture of two or more thereof.

The alkali developable photosensitive resin composition of the invention, either colored or non-colored, is applied to a substrate, such as soda glass, quartz glass, semiconductor substrates, metals, paper, plastics, or glass. The method of application is not limited. Any known coating methods may be used, such as spin coating, bar coating, roll coating, curtain coating, screen printing, inkjet printing, and dipping. The composition may be once applied to a carrier substrate, such as a film, and then transferred to another substrate.

The (colored) alkali developable photosensitive resin composition of the invention is usually used as a mixture containing the aforementioned solvent, photopolymerization initiator, and colorant. The application of the (colored) alkali developable photosensitive resin composition is not particularly limited. It finds various uses in, for example, photocuring paints, photocuring adhesives, printing plates, photoresists for printed wiring boards, pixels of color filters for plasma displays, electroluminescence panels, video cameras or liquid crystal displays, and projections for controlling multi-domain vertical alignment of liquid crystals.

Light sources of active light that can be used to cure the alkali developable photosensitive resin composition of the invention include those emitting light of wavelengths of from 300 to 450 nm. Such light sources include an ultrahigh pressure mercury lamps, mercury vapor arcs, carbon arcs, and xenon arcs.

The β-diketone compound used in the invention will then be described.

The β-diketone compound represented by general formula (I) of the invention is a novel compound. It is useful not only as an intermediate of a component making up the (colored) alkali developable photosensitive resin composition of the invention but also as a starting material of a catalyst, a probe, a fluorescent material, an oxime initiator, and so on. In addition, a metal complex containing the β-diketone compound of the invention is widely useful as, e.g., a metal alkoxide-based photosensitive resin material or an MOD material.

A β-diketone compound represented by general formula (III) below, which is derived from the β-diketone compound of the invention is also useful in the applications stated in the preceding paragraph.

[Formula 31]

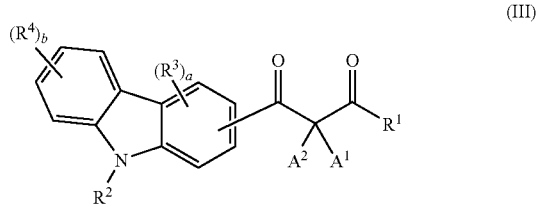

(III)

wherein $R^1$, $R^2$, $R^3$, $R^4$, a, and b are as defined for general formula (I); $A^1$ represents a substituent represented by general formula (IV) below; $A^2$ represents a hydrogen atom or a substituent represented by general formula (IV); when at least one of $A^1$ and $A^2$ is a hydrogen atom, the β-diketone moiety may have either a keto-form or an enol-form.

[Formula 32]

(IV)

wherein $R^{31}$, $R^{32}$, and $R^{33}$ each independently represent a hydrogen atom, an alkyl group having 1 to 20 carbon atoms, or an aryl group having 6 to 30 carbon atoms; $R^{34}$ represents a hydrogen atom, a hydroxyl group, an alkyl group having 1 to 20 carbon atoms, an aryl group having 6 to 30 carbon, an arylalkyl group having 7 to 30 carbon atoms, an alkoxy group having 1 to 20 carbon atoms, an aryloxy group having 6 to 30 atoms, or an arylalkoxy group having 7 to 30 carbon atoms.

In general formula (IV), examples of the alkyl group having 1 to 20 carbon atoms and the aryl group having 6 to 30 carbon atoms as represented by $R^{31}$, $R^{32}$, $R^{33}$, and $R^{34}$ and the arylalkyl group having 7 to 30 carbon atoms as represented by $R^{34}$ include those recited above with respect to general formula (I). Examples of the alkoxy group having 1 to 20 carbon atoms as represented by $R^{34}$ include methoxy, methoxymethoxy, methoxyethoxymethoxy, methylthiomethyl, ethoxy, vinyloxy, propoxy, isopropoxy, butoxy, isobutoxy, t-butoxy, t-butyldimethylsilyloxy, t-butoxycarbonylmethoxy, pentyloxy, isopentyloxy, t-pentyloxy, neopentyloxy, hexyloxy, cyclohexyloxy, isohexyloxy, heptyloxy, octyloxy, 2-ethylhexyloxy, nonyloxy, decyloxy, undecyloxy, dodecyloxy, tridecyloxy, isotridecyloxy, myristyloxy, palmityloxy, and stearyloxy. Examples of the aryloxy group having 6 to 30 carbon atoms as represented by $R^{34}$ include phenoxy, tolyloxy, xylyloxy, ethylphenoxy, chlorophenoxy, naphthoxy, anthryloxy, phenanthrenyloxy; and phenoxy, biphenylyloxy, naphthoxy, and anthryloxy substituted with at least one of the above described alkyl groups and alkoxy groups. Examples of the arylalkoxy groups having 7 to 30 carbon atoms include benzyloxy, chlorobenzyloxy, α-methylbenzyloxy, α,α-dimethylbenzyloxy, phenylethoxy, and phenylethenyloxy.

A β-diketone compound obtained by adding the β-diketone compound represented by general formula (I) or the β-diketone compound represented by general formula (III) wherein $A^2$ is hydrogen, at the position of the methylene group located between two carbonyl groups (of the β-diketone moiety), to a compound having a (meth)acryloyl group or the β-diketone compound represented by general formula (III) wherein $A^1$ and $A^2$ are both a substituent represented by general formula (IV) are useful as a photopolymerization initiator for a polymerizable compound having an ethylenically unsaturated bond. They are therefore usable as a photopolymerization initiator in a photosensitive composition. This photosensitive composition contains a photopolymerization initiator containing the above described β-diketone compound of the invention, a polymerizable compound having an ethylenically unsaturated bond, and, if desired, an inorganic compound and/or a colorant, and any other optional component, such as a solvent. In the cases where the compound having an ethylenically unsaturated bond is an alkali-developable compound, the photosensitive composition acts as an alkali developable photosensitive resin composition.

The above described β-diketone compound having a carbazolyl group exhibits high sensitivity to light. For example, a photopolymerization initiator obtained by the reaction of that compound with a compound having a (meth)acryloyl group exerts polymerization initiating ability with a small amount of light.

The β-diketone compound represented by general formula (I) is preferably used for its efficient reactivity with a compound having a (meth)acryloyl group. The β-diketone compound represented by general formula (III) in which $A^1$ and $A^2$ are both a substituent represented by general formula (IV) is useful as a photopolymerization initiator. In particular, the β-diketone compound represented by general formula (III) in which $A^1$ and $A^2$ are both a substituent represented by general formula (IV) wherein each of $R^{31}$ and $R^{32}$ is hydrogen; $R^{33}$ is hydrogen or methyl; and $R^{34}$ is an alkoxy group with 1 to 4 carbon atoms is preferred for availability of the starting materials and good productivity.

Specific examples of the β-diketone compound having a carbazolyl group represented by general formula (III) include compound Nos. 24 to 26 below:

[Formula 33]

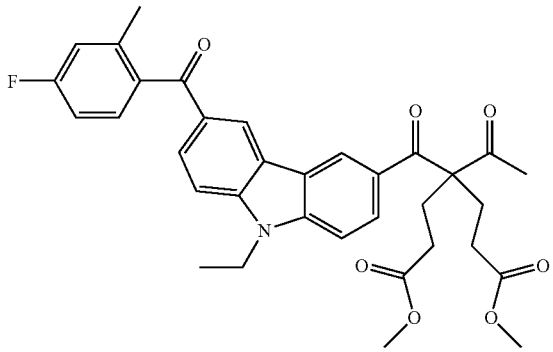

Compound No.24

[Formula 34]

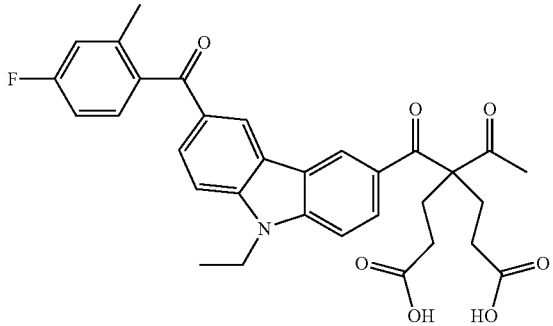

Compound No.25

[Formula 35]

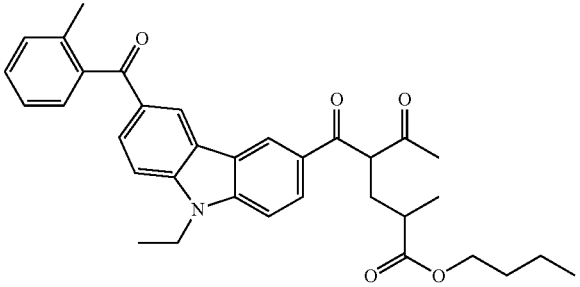

Compound No.26

Of the β-diketone compounds (III), those in which $A^1$ and $A^2$ are both a substituent (IV) (designated β-diketone compound 2 in reaction scheme below) is prepared by causing a β-diketone compound (1) (designated β-diketone compound 1 in reaction scheme below) to react with a substituted acryloyl group-containing compound in the presence of a basic catalyst.

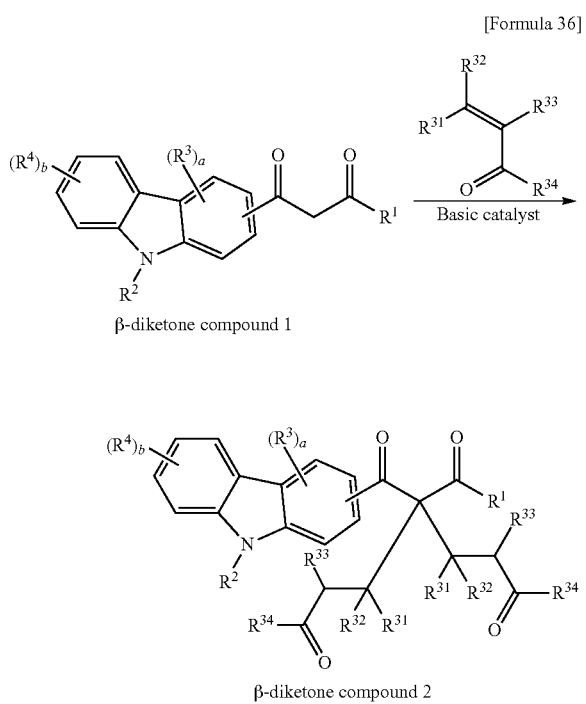

[Formula 36]

β-diketone compound 1

β-diketone compound 2

A β-diketone compound can be obtained by adding the β-diketone compound (I) or the β-diketone compound (III) wherein $A^2$ is hydrogen, at the position of its methylene group located between the two carbonyl groups of the β-diketone moiety, to a compound having a (meth)acryloyl group. The addition reaction is carried out in the presence of a base catalyst.

Examples of the compound having a (meth)acryloyl group include unsaturated monobasic acid esters, such as acrylic esters, methacrylic esters, crotonic esters, cinnamic esters, and sorbic esters, with methyl, ethyl, propyl, butyl, isoamyl, etc. Further included are pentaerythritol tetraacrylate, trimethylolpropane triacrylate, tricyclodecanedimethanol diacrylate, dipentaerythritol hexaacrylate, ditrimethylolpropane tetraacrylate, isocyanuric acid EO-modified triacrylate, bisphenol A EO-modified diacrylate, bisphenol F EO-modified diacrylate, tripropylene glycol diacrylate, polypropylene glycol diacrylate, trimethylolpropane PO-modified triacrylate, pentaerythritol triacrylate, dipentaerythritol pentaacrylate, trimethylolethane diacrylate, trimethylolpropane diacrylate, tetramethylolpropane triacrylate, and 2-hydroxy-3-acryloyloxypropyl acrylate.

Examples of the base catalyst are the same as those enumerated with reference to the preparation of the β-diketone compound 1.

The β-diketone compound obtained by the reaction described above may embrace the respective isomers according to the type of addition of the substituted acryloyl group. A mixture of such isomers can be used as such with no problem.

A β-diketone compound obtained by the addition reaction between the β-diketone represented by general formula (I), or the β-diketone compound represented by general formula (III) wherein $A^2$ is hydrogen; $R^1$ is a methyl group; a is 0; and $R^4$ is an optionally halogen-substituted acyl group having 6 to 20 carbon atoms and a (meth)acrylic ester as the compound having a (meth)acryloyl group is particularly preferred because for one thing it is easy to produce by virtue of the fast progress of the addition reaction and for another it has an absorption in a long wavelength region and exhibits high initiating ability.

The photopolymerization initiator containing the β-diketone compound is formulated together with a polymerizable compound having an ethylenically unsaturated bond, and, if desired, an inorganic compound and/or a colorant, and any other optional component, such as a solvent, to provide a photosensitive composition.

Any polymerizable compound having an ethylenically unsaturated bond commonly used in photosensitive compositions may be used, including unsaturated aliphatic hydrocarbons, such as ethylene, propylene, butylene, isobutylene, vinyl chloride, vinylidene chloride, vinylidene fluoride, and tetrafluoroethylene; (meth)acrylic acid, α-chloroacrylic acid; itaconic acid, maleic acid, citraconic acid, fumaric acid, hymic acid, crotonic acid, isocrotonic acid, vinylacetic acid, allylacetic acid, cinnamic acid, sorbic acid, mesaconic acid, trimellitic acid, pyromellitic acid, 2,2',3,3'-benzophenonetetracarboxylic acid, 3,3,4,4'-benzophenonetetracarboxylic acid, mono[2-(meth)acryloyloxyethyl]succinate, mono[2-(meth)acryloyloxyethyl]phthalate, and a mono(methacrylate) of a polymer having a carboxyl group and a hydroxyl group at both terminals, such as ω-carboxypolycaprolactone mono(meth)acrylate; unsaturated polybasic acids, such as hydroxyethyl(meth)acrylate malate, hydroxypropyl(meth)acrylate malate, dicyclopentadiene malate, and a polyfunctional (meth)acrylate having one carboxyl group and two or more (meth)acryloyl groups; 2-hydroxyethyl(meth)acrylate, 2-hydroxypropyl(meth)acrylate, glycidyl(meth)acrylate, compound Nos. 27 to 30 shown below, methyl(meth)acrylate, butyl(meth)acrylate, isobutyl(meth)acrylate, t-butyl(meth)acrylate, cyclohexyl(meth)acrylate, n-octyl(meth)acrylate, isooctyl(meth)acrylate, isononyl(meth)acrylate, stearyl (meth)acrylate, lauryl(meth)acrylate, methoxyethyl(meth)acrylate, dimethylaminomethyl(meth)acrylate, dimethylaminoethyl(meth)acrylate, aminopropyl(meth)acrylate, dimethylaminopropyl(meth)acrylate, ethoxyethyl(meth)acrylate, poly(ethoxy)ethyl(meth)acrylate, butoxyethoxyethyl(meth)acrylate, ethylhexyl(meth)acrylate, phenoxyethyl (meth)acrylate, tetrahydrofuryl(meth)acrylate, vinyl(meth)acrylate, allyl(meth)acrylate, benzyl(meth)acrylate; esters between an unsaturated monobasic acid and a polyhydric alcohol or polyhydric phenol, such as ethylene glycol di(meth)acrylate, diethylene glycol di(meth)acrylate, triethylene glycol di(meth)acrylate, polyethylene glycol di(meth)acrylate, propylene glycol di(meth)acrylate, 1,4-butanediol di(meth)acrylate, 1,6-hexanediol di(meth)acrylate, trimethylolethane tri(meth)acrylate, trimethylolpropane tri(meth)acrylate, dipentaerythritol penta(meth)acrylate, dipentaerythritol hexa(meth)acrylate, pentaerythritol penta(meth)acrylate, pentaerythritol tetra(meth)acrylate, pentaerythritol tri(meth)acrylate, tricyclodecanedimethylol di(meth)acrylate, tri[(meth)acryloylethyl]isocyanurate, and polyester (meth)acrylate oligomers; metal salts of unsaturated polybasic acids, such as zinc (meth)acrylate and magnesium (meth)acrylate; unsaturated polybasic acid anhydrides, such as maleic anhydride, itaconic anhydride, citraconic anhydride, methyltetrahydrophthalic anhydride, tetrahydrophthalic anhydride, trialkyltetrahydrophthalic anhydrides, 5-(2,5-dioxotetrahydrofuryl)-3-methyl-3-cyclohexene-1,2-dicarboxylic acid anhydride, trialkyltetrahydrophthalic anhydride-maleic anhydride adducts, dodecenylsuccinic anhydride, and methylhymic anhydride; amides formed between an unsaturated monobasic acid and a polyfunctional amine, such as (meth)acrylamide, methylenebis(meth)acrylamide, diethylenetriaminetris(meth)acrylamide, xylylenebis(meth)acrylamide, α-chloroacrylamide, and N-2-hydroxyethyl(meth)acrylamide; unsaturated aldehydes, such as acrolein; unsaturated nitriles, such as (meth)acrylonitrile, α-chloroacrylonitrile, vinylidene cyanide, and allyl cyanide; unsaturated aromatic compounds, such as styrene, 4-methylstyrene, 4-ethylstyrene, 4-methoxystyrene, 4-hydroxystyrene, 4-chlorostyrene, divinylbenzene, vinyltoluene, vinylbenzoic acid, vinylphenol, vinylsulfonic acid, 4-vinylbenzenesulfonic acid, vinylbenzyl methyl ether, and vinylbenzyl glycidyl ether; unsaturated ketones, such as methyl vinyl ketone; unsaturated amine compounds, such as vinylamine, allylamine, N-vinylpyrrolidone, and vinylpiperidine; vinyl alcohols, such as allyl alcohol and crotyl alcohol; vinyl ethers, such as vinyl methyl ether, vinyl ethyl ether, n-butyl vinyl ether, isobutyl vinyl ether, and allyl glycidyl ether; unsaturated imides, such as maleimide, N-phenylmaleimide, and N-cyclohexylmaleimide; indenes, such as indene and 1-methylindene; aliphatic conjugated dienes, such as 1,3-butadiene, isoprene, and chloroprene; macromonomers having a mono(meth)acryloyl group at the terminal of a polymeric molecular chain, such as polystyrene, polymethyl(meth)acrylate, poly-n-butyl(meth)acrylate, and polysiloxanes; vinyl chloride, vinylidene chloride, divinyl succinate, diallyl phthalate, triallyl phosphate, triallyl isocyanurate, vinyl thioether, vinylimidazole, vinyloxazoline, vinylcarbazole, vinylpyrrolidone, vinylpyridine, vinylurethane compounds formed between a hydroxyl-containing vinyl monomer and a polyisocyanate compound, and vinylepoxy compounds formed between a hydroxyl-containing vinyl monomer and a polyepoxy compound. Of these ethylenically unsaturated polymerizable compounds, a (mono)methacrylate of a polymer having a carboxyl group and a hydroxyl group at both terminals, a polyfunctional (meth)acrylate having one carboxyl group and two or more (meth)acryloyl groups, and an ester between an unsaturated monobasic acid and a polyhydric alcohol or polyhydric phenol are suited to be polymerized by using the photopolymerization initiator containing the β-diketone compound of the invention. The polymerizable compounds may be used either individually or as a mixture of two or more thereof. The two or more polymerizable compounds to be used in combination may be in the form of a copolymer previously prepared therefrom.

[Formula 37]

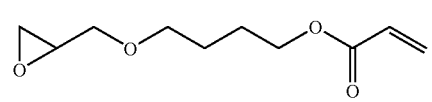

Compound No.27

[Formula 38]

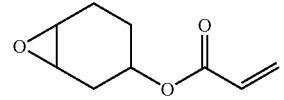

Compound No.28

[Formula 39]

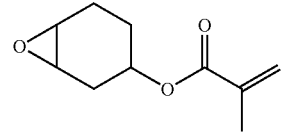

Compound No.29

[Formula 40]

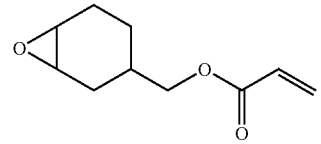

Compound No.30

When the polymerizable compound having an ethylenically unsaturated bond is an alkali-developable compound having an ethylenically unsaturated bond, the photosensitive composition is an alkali-developable photosensitive resin composition. Examples of the alkali-developable compound having ethylenically unsaturated bond include acrylic ester copolymers, phenol and/or cresol novolak epoxy resins, polyphenylmethane epoxy resins having two or more epoxy groups, and resins obtained by causing an epoxy compound, such as a compound represented by general formula (V) below, and an unsaturated monobasic acid to react with each other and causing the resulting reaction product to react with a polybasic acid anhydride. Preferred of them are resins obtained by causing an epoxy compound, such as a compound represented by general formula (V) below, and an unsaturated monobasic acid to react with each other and causing the resulting product to react with a polybasic acid anhydride. The alkali-developable compound having an ethylenically unsaturated bond preferably contains 0.2 to 1.0 equivalents of an unsaturated group.

[Formula 41]

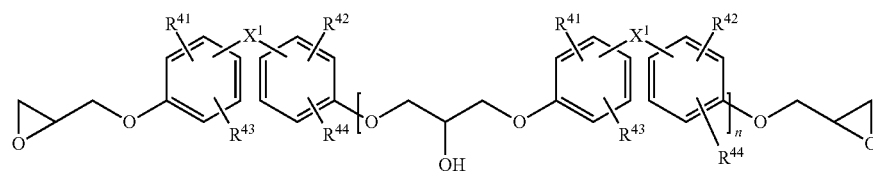

(V)

wherein $X^1$ represents a direct bond, a methylene group, an alkylidene group having 1 to 4 carbon atoms, an alicyclic hydrocarbon group having 3 to 20 carbon atoms, O, S, SO$_2$, SS, SO, CO, OCO, or a substituent represented by formula (VI) or (VII) below, in and $R^{44}$ each independently represent a hydrogen atom, an alkyl group having 1 to 5 carbon atoms, an alkoxy group having 1 to 8 carbon atoms, an alkenyl group having 2 to 5 carbon atoms, or a halogen atom, in which the alkyl group, alkoxy group, and alkenyl group may be substituted with a halogen atom; and n represents an integer of 0 to 10.

[Formula 42]

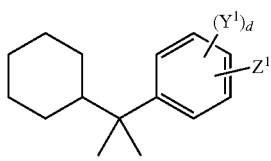

(VI)

wherein $Z^1$ represents a hydrogen atom, a phenyl group which may be substituted with an alkyl group having 1 to 10 carbon atoms or an alkoxy group having 1 to 10 carbon atoms, or a cycloalkyl group having 3 to 10 carbon atoms; $Y^1$ represents an alkyl group having 1 to 10 carbon atoms, an alkoxy group having 1 to 10 carbon atoms, an alkenyl group having 2 to 10 carbon atoms, or a halogen atom, in which the alkyl group, alkoxy group, and alkenyl group may be substituted with a halogen atom; and d represents an integer of 0 to 5.

[Formula 43]

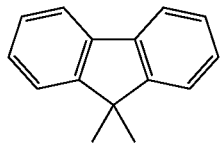

(VII)

Examples of the unsaturated monobasic acid which is caused to react on the epoxy compound include those listed with respect to the unsaturated monobasic acid (E). Examples of the polybasic acid anhydride that is caused to react after the reaction of the unsaturated monobasic acid include those stated with respect to the polybasic acid anhydride (C).

The epoxy compound, the unsaturated monobasic acid, and the polybasic acid anhydride are preferably used in such a molar ratio that results in the formation of an epoxy adduct having 0.1 to 1.0 carboxyl group of the unsaturated monobasic acid added per epoxy group of the epoxy compound and 0.1 to 1.0 acid anhydride structure per hydroxyl group of the epoxy adduct. The reactions of the epoxy compound, unsaturated monobasic acid, and polybasic acid anhydride are carried out in a usual manner.

In order to improve developability of the (colored) alkali developable photosensitive resin composition through acid value adjustment, a mono- or polyfunctional epoxy compound may be used in combination with the alkali developable compound having an ethylenically unsaturated bond. It is preferred that the solid content of the alkali-developable compound having an ethylenically unsaturated bond to have an acid value of 5 to 120 mg-KOH/g. The amount of the mono- or polyfunctional epoxy compound to be used is preferably chosen so as to satisfy the above recited range of acid value.

Examples of the monofunctional epoxy compound include glycidyl methacrylate, methyl glycidyl ether, ethyl glycidyl ether, propyl glycidyl ether, isopropyl glycidyl ether, butyl glycidyl ether, isobutyl glycidyl ether, t-butyl glycidyl ether, pentyl glycidyl ether, hexyl glycidyl ether, heptyl glycidyl ether, octyl glycidyl ether, nonyl glycidyl ether, decyl glycidyl ether, undecyl glycidyl ether, dodecyl glycidyl ether, tridecyl glycidyl ether, tetradecyl glycidyl ether, pentadecyl glycidyl ether, hexadecyl glycidyl ether, 2-ethylhexyl glycidyl ether, allyl glycidyl ether, propargyl glycidyl ether, p-methoxyethyl glycidyl ether, phenyl glycidyl ether, p-methoxyglycidyl ether, p-butylphenyl glycidyl ether, cresyl glycidyl ether, 2-methylcresyl glycidyl ether, 4-nonylphenyl glycidyl ether, benzyl glycidyl ether, p-cumylphenyl glycidyl ether, trimethyl glycidyl ether, 2,3-epoxypropyl methacrylate, epoxidized soybean oil, epoxidized linseed oil, glycidyl butyrate, vinylcyclohexene monoxide, 1,2-epoxy-4-vinylcyclohexane, styrene oxide, pinene oxide, methylstyrene oxide, cyclohexene oxide, propylene oxide, and compound Nos. 28 and 29 supra.

The polyfunctional epoxy compound is preferably at least one compound selected from the group consisting of the bisphenolic epoxy compounds and glycidyl ethers described with reference to the epoxy compound (D). Using at least one of them is effective in providing a (colored) alkali developable photosensitive resin composition having further improved characteristics. The epoxy compound represented by general formula (V) also serves as the bisphenolic epoxy compound.

The amount of the photopolymerization initiator to be used in the photosensitive composition is limited. However, the amount of the β-diketone compound of the invention used as a photopolymerization initiator is preferably 1 to 70 parts, more preferably 1 to 50 parts, even more preferably 5 to 30 parts, by mass per 100 parts by mass of the polymerizable compound having an ethylenically unsaturated bond.

In the case when the photosensitive composition is contemplated to be a (colored) alkali developable photosensitive resin composition, the content of the alkali developable compound having an ethylenically unsaturated bond in the composition is preferably 1% to 20%, more preferably 3% to 12%, by mass.

If desired, the photosensitive composition may contain other known photopolymerization initiator or sensitizer in addition to the β-diketone compound of the invention. A combined use of other photopolymerization initiator can produce marked synergistic effects. Examples of useful photopolymerization initiators include those described supra with reference to the photopolymerization initiator (F). The photopolymerization initiators may be used either individually or as a combination of two or more thereof. The amount of the known photopolymerization initiator(s), if used, is preferably equal to or less than the mass of the β-diketone compound of the invention.

The photosensitive composition may optionally contain a solvent. Usually, solvents capable of dissolving or dispersing the above described components (such as the β-diketone compound and the polymerizable compound having an ethylenically unsaturated bond) are used where necessary. Useful solvents include those enumerated above for use in the alkali developable photosensitive resin composition. The solvents may be used either individually or as a mixture of two or more thereof. Preferred of them are ketones and cellosolve solvents, particularly propylene glycol 1-monomethyl ether 2-acetate, cyclohexanone, and so on in view of providing good compatibility between a resist and a photopolymerization initiator in a photosensitive composition.

The photosensitive composition may further contain an inorganic compound. Examples of the inorganic compound include metal oxides, such as nickel oxide, iron oxide, iridium oxide, titanium oxide, zinc oxide, magnesium oxide, calcium oxide, potassium oxide, silica, and alumina; layered clay minerals, Milori blue, calcium carbonate, magnesium carbonate, cobalt compounds, manganese compounds, glass powder, mica, talc, kaolin, ferrocyanides, various metal sulfates, sulfides, selenides, aluminum silicate, calcium silicate, aluminum hydroxide, platinum, gold, silver, and copper. Preferred of them are titanium oxide, silica, layered clay minerals, and silver. The inorganic compound content in the photosensitive composition is preferably 0.1 to 50 parts, more preferably 0.5 to 20 parts, by mass per 100 parts by mass of the polymerizable compound having an ethylenically unsaturated bond. The inorganic compounds may be used either individually or in combination of two or more thereof.

The inorganic compounds are used to serve as, for example, a filler, an antireflection agent, an electrically conductive agent, a stabilizer, a flame retardant, a mechanical strength improving agent, a specific wavelength absorbing agent, an ink repellent agent, and the like.

The photosensitive composition, especially the alkali developable photosensitive resin composition may further contain a colorant to be formulated into a colored photosensitive composition. Useful colorants include those described above with reference to the colorant (G). The colorants may be used either individually or as a mixture of two or more thereof.

The amount of the colorant to be added to the photosensitive composition is preferably 50 to 350 parts, more preferably 100 to 250 parts, by mass per 100 parts by mass of the polymerizable compound having an ethylenically unsaturated bond.

The photosensitive composition may further contain other organic polymer in addition to the polymerizable compound having an ethylenically unsaturated bond to provide a cured product with improved characteristics. Examples of the organic polymer include polystyrene, polymethyl methacrylate, methyl methacrylate-ethyl acrylate copolymers, poly(meth)acrylic acid, styrene-(meth)acrylic acid copolymers, (meth)acrylic acid-methyl methacrylate copolymers, ethylene-vinyl chloride copolymers, ethylene-vinyl alcohol copolymers, polyvinyl chloride resins, ABS resins, nylon 6, nylon 66, nylon 12, urethane resins, polycarbonate, polyvinyl butyral, cellulose esters, polyacrylamide, saturated polyesters, phenol resins, phenoxy resins, polyamide-imide resins, polyamic acid resins, and epoxy resins. Preferred of them are polystyrene, (meth)acrylic acid-methyl acrylate copolymers, and epoxy resins. The amount of the other organic polymer, when used in combination, is preferably 10 to 500 parts by mass per 100 parts by mass of the polymerizable compound having an ethylenically unsaturated bond.

If desired, the photosensitive composition may contain commonly used additives, including thermal polymerization inhibitors (e.g., p-anisole, hydroquinone, pyrocatechol, t-butylcatechol, and phenothiazine), plasticizers, adhesion accelerators, fillers, anti-foaming agents, leveling agents, surface modifiers, antioxidants, ultraviolet absorbers, dispersing acids, anti-coagulants, catalysts, effect accelerators, sensitizers, crosslinking agents, and thickeners.

The amounts of the optional components other than the polymerizable compound having an ethylenically unsaturated bond and the β-diketone compound of the invention, except the above described other photopolymerization initiator, inorganic filler, colorant, and solvent, in the photosensitive composition are decided as appropriate to the use of the composition. Preferably, the total amount of these optional components is not more than 50 parts by mass per 100 parts by mass of the polymerizable compound having an ethylenically unsaturated bond.

Similarly to the alkali developable photosensitive resin composition, the photosensitive composition may contain a monomer having an unsaturated bond, a chain transfer agent, a surfactant, and so on.

The photosensitive composition may be applied to a substrate in the same manner as described for the alkali developable photosensitive resin composition.

The photosensitive composition may be cured using the same source of active light as described for the alkali developable photosensitive resin composition.

Applications of the photosensitive composition is not particularly limited. It finds various uses in, for example, photocuring paints or varnishes, photocuring adhesives, printed boards; color filters for liquid crystal color display devices, such as TV monitors, PC monitors, personal digital assistances, and digital cameras, and for CCD image sensors; electrode materials for plasma display panels; powder coatings, printing inks, printing plates, adhesives, compositions for dental use, gel coats, photoresists for electronics, electroplating resists, etching resists, liquid and dry films, soldering resists; resists for producing color filters of various displays or for forming structures in the production of plasma display panels, electroluminescent displays, and LCDs; encapsulating compositions for electric/electronic components, magnetic recording materials, fine machine parts, waveguides, optical switches, plating masks, etching masks, color test systems, glass fiber cable coatings, screen printing stencils, materials for making a three-dimensional object by stereolithography, holographic recording materials, image recording materials, fine electronic circuits, decolorizing materials, decolorizing materials for image recording materials, decolorizing materials for image recording materials using microcapsules, photoresist materials for printed wiring boards, photoresist materials for direct image writing using UV and visible lasers, and photoresist materials or protective layers used to form dielectric layers in the fabrication of multilayered printed circuit boards.

EXAMPLES

The present invention will now be illustrated in greater detail with reference to Examples, but it should be understood that the invention is not deemed to be limited thereto. All the percents are by mass.

Examples 1-1 to 1-3 demonstrate the synthesis of β-diketone compound Nos. 1 to 3 of the invention. Examples 2-1 and 2-2 demonstrate the preparation of β-diketone compound Nos. 24 and 25. Examples 3-1 and 3-2 demonstrate the preparation of photosensitive composition Nos. 1 and 2 using the β-diketone compounds. Examples 4-1 through 4-21 demonstrate the preparation of alkali developable photosensitive resin compositions containing a photopolymerizable unsaturated compound (J). Examples 5-1 through 5-21 demonstrate the preparation of alkali developable photosensitive resin compositions of the invention by mixing the alkali developable photosensitive resin compositions of Examples 4-1 to 4-21 with a monomer having an unsaturated bond and a solvent. Examples 6-1 to 6-5 show the preparation of colored alkali developable photosensitive resin compositions of the invention by mixing the alkali developable photosensitive resin compositions of Examples 4-17 to 4-21 with a colorant (G), a monomer having an unsaturated bond, and a solvent. Examples 7-1 to 7-16 demonstrate the preparation of alkali developable photosensitive resin compositions of the invention by mixing a photopolymerization initiator (F), a monomer having an unsaturated bond, and a solvent into the alkali developable photosensitive resin compositions of Examples 4-1 to 4-16. Examples 8-1 to 8-21 show the preparation of colored alkali developable photosensitive resin compositions of the invention by mixing a photopolymerization initiator (F), a colorant (G), a monomer having an unsaturated bond, and a solvent into the alkali developable photosensitive resin compositions of Examples 4-1 to 4-21.

Example 1-1

Preparation of 1-(9-propyl-9H-carbazol-3-yl)butane-1,3-dione (compound No. 1)

A 200 ml four-necked flask equipped with a stirrer, a nitrogen inlet tube, a reflex condenser, and a thermometer was charged with 25.13 g of 1-(9-propyl-9H-carbazol-3-yl)ethanone, 88.11 g of ethyl acetate, and 16.83 g of potassium t-butoxide, and the mixture was refluxed in a nitrogen atmosphere for 5 hours. After cooling to room temperature, 50 ml of ion exchanged water and 50 ml of 6N hydrochloric acid were successively added, followed by stirring. The organic phase was separated and mixed with 200 ml of ethyl acetate, and the mixture was washed with a sodium chloride aqueous solution until neutral. The upper layer was dried with magnesium sulfate, and the solvent was removed by evaporation. The solid thus precipitated was dissolved in 10 ml of ethyl acetate under reflux, and n-hexane was added thereto. The precipitate thus formed was collected by filtration and dried under reduced pressure to give 23.15 g (79%) of yellow crystals, which had a melting point of 97° C. and was identified by various analyses to be β-diketone compound No. 1 having a carbazolyl group.

Example 1-2

Preparation of 1-[9-ethyl-6-(4-fluoro-2-methylbenzoyl)-9H-carbazol-3-yl]butane-1,3-dione (compound No. 2)

A one liter four-necked flask equipped with a stirrer, a nitrogen inlet tube, a reflex condenser, and a thermometer was charged with 74.69 g of 1-[9-ethyl-6-(4-fluoro-2-methylbenzoyl)-9H-carbazol-3-yl]ethanone, 538.66 g of ethyl acetate, and 67.33 g of potassium t-butoxide, and the mixture was refluxed in a nitrogen atmosphere for 1 hour. The reaction mixture was cooled to room temperature, and the white solid thus precipitated was collected by filtration by suction and washed with 500 ml of ethyl acetate. The resulting solid was stirred in 500 ml of 2N hydrochloric acid and 1.5 liters of ethyl acetate. The organic phase was washed with water until neutral. The organic phase was separated, dried with 70 g of magnesium sulfate, and filtered by suction. The solvent was removed by evaporation to give a pale yellow solid. The solid was dissolved in 150 ml of ethyl acetate and refluxed, and 100 ml of n-hexane was added thereto, followed by cooling to room temperature for crystallization. The filtrate was dissolved in 50 ml of ethyl acetate, refluxed, and 100 ml of n-hexane was added, followed by cooling to room temperature for crystallization. The resulting crystals were combined, collected by filtration by suction, and dried under reduced pressure to give 8.52 g (21%) of white crystals, which had a melting point of 132° C. and was identified by various analyses to be β-diketone compound No. 2 having a carbazolyl group.

Example 1-3

Preparation of 1-[9-ethyl-6-(2-methylbenzoyl)-9H-carbazol-3-yl]butane-1,3-dione (compound No. 3)

A one liter four-necked flask equipped with a stirrer, a nitrogen inlet tube, a reflex condenser, and a thermometer was charged with 35.54 g of 1-[9-ethyl-6-(2-methylbenzoyl)-9H-carbazol-3-yl]ethanone, 264.33 g of ethyl acetate, and 33.66 g of potassium t-butoxide, and the mixture was refluxed in a nitrogen atmosphere for 5 hours. After cooling to room temperature, 100 ml of ion exchanged water and 100 ml of 6N hydrochloric acid were successively added, followed by stirring. The organic phase was separated and washed with a sodium chloride aqueous solution until neutral. A hundred fifty milliliters of n-hexane was added thereto, followed by cooling with ice for crystallization. The solid precipitated was collected by filtration by suction and dried under reduced pressure to give 17.29 g (43%) of pale yellow crystals, which had a melting point of 148° C. and was identified by various analyses to be β-diketone compound No. 3 having a carbazolyl group.

The identification results of compound Nos. 1 to 3 obtained in Examples 1-1 to 1-3 are shown in Tables 1 and 2.

TABLE 1

|  |  | IR Absorption ($cm^{-1}$) |
|---|---|---|
| Example 1-1 | Compound No. 1 | 3436, 2966, 2944, 2927, 2875, 1624, 1592, 1491, 1469, 1388, 1345, 1332, 1293, 1279, 1266, 1252, 1221, 1195, 1151, 1131, 1080, 1062, 1021, 992, 903, 876, 836, 812, 789, 754, 721 |
| Example 1-2 | Compound No. 2 | 3427, 3060, 2984, 2938, 1649, 1623, 1592, 1489, 1454, 1386, 1352, 1312, 1299, 1253, 1236, 1194, 1158, 1129, 1099, 1054, 1023, 971, 898, 862, 825, 811, 775, 731, 706, 669 |
| Example 1-3 | Compound No. 3 | 3451, 3080, 2968, 1656, 1625, 1590, 1486, 1449, 1390, 1349, 1313, 1293, 1261, 1234, 1189, 1161, 1131, 1024, 965, 936, 913, 834, 774, 750, 727, 633 |

TABLE 2

| | | $^1$H-NMR (ppm) |
|---|---|---|
| Example 1-1 | Compound No. 1 (DMSO-d$^6$) | (1) 0.88 (t, 3H), 1.81 (tq, 2H), 2.27 (s, 3H), 4.37 (s, 2H), 4.42 (t, 2H), 7.29 (ddd, 1H), 7.51 (ddd, 1H), 7.68 (dd, 1H), 7.72 (dd, 1H), 8.05 (dd, 1H), 8.29 (d, 1H), 8.84 (d, 1H) (2) 0.88 (t, 3H), 1.81 (tq, 2H), 2.20 (s, 3H), 4.42 (t, 2H), 6.70 (s, 1H), 7.29 (ddd, 1H), 7.51 (ddd, 1H), 7.68 (dd, 1H), 7.72 (dd, 1H), 8.08 (dd, 1H), 8.29 (d, 1H), 8.88 (d, 1H) (1) keto/(2) enol = 27/73 |
| Example 1-2 | Compound No. 2 (DMSO-d$^6$) | (1) 1.35 (t, 3H), 2.26 (s, 3H), 2.29 (s, 3H), 4.38 (s, 2H), 4.54 (q, 2H), 7.16 (d, 1H), 7.27 (d, 1H), 7.44 (dd, 1H), 7.80 (d, 1H), 7.81 (s, 1H), 7.88 (d, 1H), 8.10 (d, 1H), 8.69 (d, 1H), 8.97 (s, 1H) (2) 1.35 (t, 3H), 2.19 (s, 3H), 2.29 (s, 3H), 4.54 (q, 2H), 6.74 (s, 1H), 7.18 (d, 1H), 7.27 (d, 1H), 7.44 (dd, 1H), 7.80 (d, 1H), 7.81 (s, 1H), 7.90 (dd, 1H), 8.14 (dd, 1H), 8.68 (d, 1H), 8.97 (s, 1H) (1) keto/(2) enol = 27/73 |
| Example 1-3 | Compound No. 3 (DMSO-d$^6$) | (1) 1.38 (t, 3H), 2.27 (s, 3H), 4.40 (s, 2H), 4.57 (q, 2H), 7.34-7.43 (m, 3H), 7.51 (ddd, 1H), 7.82 (dd, 1H), 7.83 (dd, 1H), 7.87 (dd, 1H), 8.12 (dd, 1H), 8.74 (d, 1H), 8.97 (d, 1H) (2) 1.38 (t, 3H), 2.21 (s, 3H), 4.57 (q, 2H), 6.78 (s, 1H), 7.34-7.43 (m, 3H), 7.50 (ddd, 1H), 7.82 (dd, 1H), 7.83 (dd, 1H), 7.90 (dd, 1H), 8.17 (dd, 1H), 8.72 (d, 1H), 8.99 (d, 1H) (2) keto/(2) enol = 28/72 |

Example 2-1

Preparation of adduct between methyl acrylate and 1-[9-ethyl-6-(4-fluoro-2-methylbenzoyl)-9H-carbazol-3-yl]-butane-1,3-dione (compound No. 24)

A 100 ml four-necked flask equipped with a stirrer, a nitrogen/oxygen inlet tube, a reflex condenser, and a thermometer was charged with 8.31 g of 1-[9-ethyl-6-(4-fluoro-2-methylbenzoyl)-9H-carbazol-3-yl]-butane-1,3-dione (compound No. 2), 17.22 g of methyl acrylate, and 0.30 g of 1,8-diazabicyclo[5.4.0]-7-undecene, and the mixture was refluxed at 70° C. for 8 hours in a nitrogen/oxygen atmosphere. After cooling, about 150 ml of ethyl acetate was added, and 100 ml of a saturated sodium chloride aqueous solution, 100 ml of ion exchanged water, and 6 ml of 1N hydrochloric acid were further added thereto, followed by stirring. The organic layer was separated, washed with water until neutral. To the washed organic layer was added 10 ml of toluene, followed by concentration to dryness. The solid was further dried in vacuo at 110° C. to give 9.47 g (81%) of a brown glassy substance. The brown glassy substance was identified by various analyses to be compound No. 24 resulting from addition of 1 mol of 1-[9-ethyl-6-(4-fluoro-2-methylbenzoyl)-9H-carbazol-3-yl]-butane-1,3-dione to 2 mol of methyl acrylate.

Example 2-2

Preparation of adduct between acrylic acid and 1-[9-ethyl-6-(4-fluoro-2-methylbenzoyl)-9H-carbazol-3-yl]-butane-1,3-dione (compound No. 25)

A 300 ml pear-shaped flask equipped with a stirrer, a Dean-Stark trap, and a reflex condenser was charged with 5.39 g of the adduct of methyl acrylate and 1-[9-ethyl-6-(4-fluoro-2-methylbenzoyl)-9H-carbazol-3-yl]-butane-1,3-dione synthesized above (compound No. 24), 50 ml of t-butanol, and 10 ml of 3N hydrochloric acid, and the mixture was stirred at a bath temperature of 105° C. for 12 hours, while removing methanol using the Dean-Stark trap. During the 8-hour reaction 10 ml of 3N hydrochloric acid was added to the reaction system. After completion of the reaction, the solvent and hydrochloric acid were removed by evaporation under reduced pressure at a bath temperature of 120° C. To the resulting solid were added 20 ml of ion exchanged water and 20 ml of acetone, followed by refluxing. The lower layer was separated, concentrated to dryness, and dried in vacuo at 70° C. to give 4.06 g (79%) of a pale yellow glassy substance. The pale yellow glassy substance was identified by various analyses to be compound No. 25 resulting from addition of 1 mol of 1-[9-ethyl-6-(4-fluoro-2-methylbenzoyl)-9H-carbazol-3-yl]-butane-1,3-dione to 2 mol of acrylic acid.

Comparative Example 1

Preparation of methyl acrylate-benzoylacetone adduct (comparative compound No. 1)

A 100 ml four-necked flask equipped with a stirrer, a nitrogen/oxygen inlet tube, a reflex condenser, and a thermometer was charged with 4.87 g of benzoylacetone, 6.89 g of methyl acrylate, and 0.15 g of 1,8-diazabicyclo[5.4.0]-7-undecene, and the mixture was refluxed at 60° C. for 8 hours in a nitrogen/oxygen atmosphere. After cooling, about 100 ml of ethyl acetate was added, and 100 ml of a saturated sodium chloride aqueous solution, 100 ml of ion exchanged water, and 2 ml of 1N hydrochloric acid were further added thereto, followed by stirring. The organic layer was separated, washed with water until neutral, concentrated to dryness, and dried in vacuo at 60° C. to give 9.55 g (95%) of a brown liquid. The brown liquid was identified by various analyses to be an isomeric mixture containing comparative compound No. 1 resulting from addition of 1 mol of benzoylacetone to 2 mol of methyl acrylate.

The identification results of compound Nos. 24 and 25 and comparative compound No. 1 obtained in Examples 2-1 and 2-2 and Comparative Example 1, respectively, are shown in Tables 3 and 4.

TABLE 3

| | | IR Absorption (cm$^{-1}$) |
|---|---|---|
| Example 2-1 | Compound No. 24 | 3503, 2952, 1736, 1657, 1623, 1588, 1486, 1437, 1381, 1362, 1338, 1308, 1254, 1235, 1200, 1174, 1156, 1128, 1097, 1022, 964, 866, 819, 771, 729, 674 |
| Example 2-2 | Compound No. 25 | 3060, 2979, 1711, 1658, 1622, 1588, 1486, 1450, 1429, 1385, 1362, 1339, 1309, 1255, 1235, 1180, 1156, 1128, 1097, 1023, 964, 916, 866, 819, 771, 729, 669 |
| Comparative Example 1 | Comparative Compound No. 1 | 3628, 3490, 3060, 2953, 2847, 2595, 2361, 1976, 1738, 1672, 1597, 1579, 1493, 1438, 1361, 1201, 1176, 1099, 1081, 1001, 987, 887, 853, 769, 731, 702 |

TABLE 4

| | | $^1$H-NMR (ppm) |
|---|---|---|
| Example 2-1 | Compound No. 24 (CDCl$_3$) | 1.52 (t, 3H), 2.06-2.55 (m, 8H), 2.15 (s, 3H), 2.39 (s, 3H), 3.64 (s, 6H), 4.43 (q, 2H), 7.02 (dd, 1H), 7.07 (dd, 1H), 7.41 (d, 1H), 7.51 (d, 1H), 7.51 (s, 1H), 7.94 (dd, 1H), 8.06 (dd, 1H), 8.53 (d, 1H), 8.67 (d, 1H) |
| Example 2-2 | Compound No. 25 (CDCl$_3$) | 1.51 (t, 3H), 2.06-2.57 (m, 8H), 2.14 (s, 3H), 2.39 (s, 3H), 4.44 (q, 2H), 6.99 (dd, 1H), 7.07 (d, 1H), 7.40 (d, 1H), 7.49 (d, 1H), 7.49 (s, 1H), 7.93 (dd, 1H), 8.07 (dd, 1H), 8.53 (d, 1H), 8.67 (d, 1H) |
| Comparative Example 1 | Comparative Compound No. 1 (DMSO-d$^6$) | 1.89-2.30 (m, 8H), 2.13 (s, 3H), 3.50 (s, 6H), 7.47-7.67 (m, 5H) |

Preparation Example 1

Preparation of Alkali Developable Compound

In a reactor were put 390 g of 1,1-bis[4-(2,3-epoxypropyloxy)phenyl]-1-(4-biphenyl)-1-cyclohexylmethane, 71.1 g of acrylic acid, 1.34 g of 2,6-di-t-butyl-p-cresol, 1.75 g of tetrabutylammonium chloride, and 108 g of propylene glycol-1-monomethyl ether-2-acetate and stirred at 90° C. for 1 hour, at 100° C. for 1 hour, at 110° C. for 1 hour, and finally at 120° C. for 17 hours. After cooling to room temperature, 59.2 g of biphenyltetracarboxylic acid dianhydride, 45.2 g of tetrahydrophthalic anhydride, 4.08 g of tetrabutylammonium chloride, and 137 g of propylene glycol-1-monomethyl ether-2-acetate were added to the reaction mixture, followed by stirring at 120° C. for 5 hours, 90° C. for 1 hour, 60° C. for 2 hours, and finally at 40° C. for 3 hours. To the reaction mixture was added 203 g of propylene glycol-1-monomethyl ether-2-acetate to obtain a propylene glycol-1-monomethyl ether-2-acetate solution of a desired alkali developable compound (Mw: 3700; Mn: 2000; acid value (solid content): 91 mg-KOH/g).

Examples 3-1 and 3-2 and Comparative Example 2

Preparation of Photosensitive Composition Nos. 1 and 2 (Alkali Developable Photosensitive Resin Compositions) and Comparative Photosensitive Composition No. 1

The alkali developable compound obtained in Preparation Example 1 (8.9 g), 4.0 g of trimethylolpropane triacrylate, 1.0 g of each of compound Nos. 24 and 25 obtained in Examples 2-1 and 2-2 and comparative compound No. 1 obtained in Comparative Example 1, 13.1 g of Propylene glycol-1-monomethyl ether-2-acetate, and 10.0 g of cyclohexanone were thoroughly mixed to furnish photosensitive composition Nos. 1 and 2 and comparative photosensitive composition No. 1, respectively.

Evaluation Examples 1-1 and 1-2 and Comparative Evaluation Example 1

Photosensitive composition Nos. 1 and 2 and comparative photosensitive composition No. 1 were evaluated as follows. The results of evaluation are shown in Table 5.

Each of the photosensitive compositions was applied to a glass substrate by spin coating (700 rpm, 5 seconds), dried in air for 15 minutes, and prebaked on a 90° C. hot plate for 90 seconds. The prebaked coating layer was patternwise exposed to light from a high pressure mercury lamp at six exposures ranging from 50 to 1000 mJ/cm$^2$ through a mask having an opening size of 30 μm, immersed in a 2.5 mass % sodium carbonate aqueous solution at 25° C. for 40 seconds (development), thoroughly washed with water, dried, and baked at 230° C. for 1 hour to fix the pattern. The line width of the resulting pattern was measured. The results are shown in Table 5.

TABLE 5

| | Line Width (μm) | | |
|---|---|---|---|
| Exposure (mJ/cm$^2$) | Photosensitive Composition No. 1 | Photosensitive Composition No. 2 | Comparative Photosensitive Composition No. 1 |
| 50 | 25.9 | 24.9 | — |
| 100 | 28.8 | 28.5 | — |
| 200 | 30.6 | 31.2 | — |
| 400 | 33.1 | 33.2 | — |
| 800 | 35.0 | 35.5 | — |
| 1000 | 36.0 | 37.0 | — |

It is seen that photosensitive composition Nos. 1 and 2 have sufficient sensitivity for pattern formation even at 50 mJ/cm$^2$ whereas comparative photosensitive composition No. 1 has too poor sensitivity to form a pattern even at an exposure of 1000 mJ/cm$^2$.

Example 4-1

Preparation of Alkali Developable Photosensitive Resin Composition No. 1-1

Step 1: Preparation of bis(4-hydroxyphenyl)-4-biphenylyl (cyclohexyl)methane

A reactor was charged with 70.5 g of biphenylcyclohexyl ketone, 200.7 g of phenol, and 10.15 g of thioacetic acid, and 40.0 g of trifluoromethanesulfonic acid was added thereto dropwise at 18° C. over 20 minutes. After the reaction was effected at 17° to 19° C. for 18 hours, 500 g of water was added to stop the reaction. To the reaction mixture was added 500 g of toluene. The organic layer was washed with water to pH 3 to 4. The organic layer was separated, and toluene, water, and the excess of phenol were removed therefrom by evaporation. Toluene was added to the residue, and the precipitated solid was collected by filtration and washed by dispersing in toluene to give 59.2 g (51%) of pale yellow crystals. The pale yellow crystals had a melting point of 239.5° C. and was confirmed to be the desired product.

Step 2: Preparation of bis[4-(2,3-epoxypropoxy)phenyl]-4-biphenylyl(cyclohexyl)methane A reactor was charged with 57.5 g of the bis(4-hydroxyphenyl)-4-biphenylyl(cyclohexyl)methane obtained in Step 1 and 195.8 g of epichlorohydrin, and 0.602 g of benzyltriethylammonium chloride was added thereto, followed by stirring at 64° C. for 18 hours. The reaction system was cooled to 54° C., and 43.0 g of a 24 wt % sodium hydroxide aqueous solution was added thereto dropwise, followed by stirring for 30 minutes. Epichlorohydrin and water were removed from the reaction system by evaporation, and 216 g of methyl isobutyl ketone was added thereto. After washing with water, 2.2 g of a 24 wt % sodium hydroxide aqueous solution was added dropwise, followed by stirring at 80° C. for 2 hours. The reaction mixture was cooled to room temperature, neutralized with a 3 wt % sodium monophosphate aqueous solution, and washed with water. The solvent was removed by evaporation to give 57 g (79%) of a yellow solid (melting point: 64.2° C.; epoxy equivalent: 282; n=0.04). The yellow crystals were confirmed to be the desired product.

Step 3: Preparation of Alkali Developable Photosensitive Resin Composition No. 1

In a reactor were put 89.9 g of bis[4-(2,3-epoxypropoxy)phenyl]-4-biphenylyl(cyclohexyl)methane (hereinafter "compound d-1"), 23.5 g of acrylic acid (hereinafter "compound e-1"), 0.457 g of 2,6-di-tert-butyl-p-cresol, 0.534 g of benzyltriethylammonium chloride, and 75.6 g of Propylene glycol-1-monomethyl ether-2-acetate and stirred at 120° C. for 16 hours. After cooling to room temperature, 12.0 g of 2,4-pentanedione (hereinafter "compound b-1") and 1.0 g of triethylamine were added to the reaction mixture, followed by stirring at 92° C. for 17 hours. The reaction mixture was cooled to room temperature, and 25.6 g of succinic anhydride (hereinafter "compound c-1"), 1.39 g of tetra-n-butylammonium bromide, and 40.42 g of Propylene glycol-1-monomethyl ether-2-acetate were added thereto, followed by stirring at 100° C. for 5 hours. The reaction mixture was cooled to room temperature, and 46.7 g of Propylene glycol-1-monomethyl ether-2-acetate was added to provide alkali developable photosensitive resin composition No. 1-1 as the desired product in the form of a Propylene glycol-1-monomethyl ether-2-acetate solution (Mw: 4090; Mn: 2630; acid value (solid content): 102 mg-KOH/g).

The photopolymerizable unsaturated compound (J) contained in alkali developable photosensitive resin composition No. 1-1 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct in a ratio of 0.75 or fewer hydrogen atoms (of the methylene group located between the two keto groups of the β-diketone moiety of compound b-1) per acrylate group of the epoxy adduct, and addition of compound c-1 as component (C) to the resulting adduct in a ratio of 0.8 acid anhydride structures (of compound c-1) per hydroxyl group of the adduct.

Example 4-2

Preparation of Alkali Developable Photosensitive Resin Composition No. 1-2

In a reactor were put 23.2 g of 9,9-bis[4-(2,3-epoxypropoxy)phenyl]-9H-fluorene (hereinafter "compound d-2"), 7.35 g of acrylic acid (compound e-1), 0.084 g of 2,6-di-tert-butyl-p-cresol, 0.167 g of benzyltriethylammonium chloride, and 20.4 g of Propylene glycol-1-monomethyl ether-2-acetate and stirred at 120° C. for 16 hours. After cooling to room temperature, 3.75 g of 2,4-pentanedione (compound b-1) and 0.304 g of triethylamine were added to the reaction mixture, followed by stirring at 92° C. for 17 hours. The reaction mixture was cooled to room temperature, and 7.42 g of Propylene glycol-1-monomethyl ether-2-acetate was added. To the mixture were further added 8.01 g of succinic anhydride (compound c-1), 0.389 g of tetra-n-butylammonium bromide, and 14.3 g of Propylene glycol-1-monomethyl ether-2-acetate, followed by stirring at 100° C. for 5 hours. The reaction mixture was cooled to room temperature, 17.3 g of Propylene glycol-1-monomethyl ether-2-acetate was added to provide alkali developable photosensitive resin composition No. 1-2 as the desired product in the form of a Propylene glycol-1-monomethyl ether-2-acetate solution (Mw: 4020; Mn: 2580; acid value (solid content): 114 mg-KOH/g).

The photopolymerizable unsaturated compound (J) contained in alkali developable photosensitive resin composition No. 1-2 is a compound obtained by addition of compound e-1 as component (E) to compound d-2 as component (D) in a ratio of 1.0 carboxyl group (of compound e-1) per epoxy group (of compound d-2) to make an epoxy adduct as component (A), Michael addition polymerization of compound b-1 as component (B) to the epoxy adduct in a ratio of 0.75 or fewer hydrogen atoms (of the methylene group located between the two keto groups of the β-diketone moiety of compound b-1) per acrylate group of the epoxy adduct, and addition of compound c-1 as component (C) to the resulting adduct in a ratio of 0.8 acid anhydride structures (of compound c-1) per hydroxyl group of the adduct.

Example 4-3

Preparation of Alkali Developable Photosensitive Resin Composition No. 1-3

In a reactor were put 185 g of 2,2-bis[4-(2,3-epoxypropoxy)phenyl]propane (hereinafter "compound d-3"), 73.5 g of acrylic acid (compound e-1), 0.718 g of 2,6-di-tert-butyl-p-cresol, 1.67 g of benzyltriethylammonium chloride, and 174 g of Propylene glycol-1-monomethyl ether-2-acetate and stirred at 120° C. for 16 hours. After cooling to room temperature, a 139 g portion of the reaction mixture was taken out, and 12.0 g of 2,4-pentanedione (compound b-1) and 0.971 g of triethylamine were added thereto, followed by stirring at 92° C. for 17 hours. The reaction mixture was cooled to room temperature, and 16.0 g of succinic anhydride (compound c-1), 14.4 g of tetra-n-butylammonium bromide, and 83.5 g of Propylene glycol-1-monomethyl ether-2-acetate, followed by stirring at 100° C. for 5 hours. The reaction mixture was cooled to room temperature to provide alkali developable photosensitive resin composition No. 1-3 as the desired product in the form of a Propylene glycol-1-monomethyl ether-2-acetate solution (Mw: 3170; Mn: 2000; acid value (solid content): 88.0 mg-KOH/g).

The photopolymerizable unsaturated compound (J) contained in alkali developable photosensitive resin composition No. 1-3 is a compound obtained by addition of compound e-1 as component (E) to compound d-3 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct in a ratio of 0.75 or fewer hydrogen atoms (of the methylene group located between the two keto groups of the β-diketone moiety of compound b-1) per acrylate group of the epoxy adduct, and addition of compound c-1 as component (C) to the resulting adduct in a ratio of 0.5 acid anhydride structures (of compound c-1) per hydroxyl group of the adduct.

Example 4-4

Preparation of Alkali Developable Photosensitive Resin Composition No. 1-4

In a reactor were put 84.3 g of bis[4-(2,3-epoxypropoxy)phenyl]-4-biphenylyl(cyclohexyl)methane (compound d-1), 22.1 g of acrylic acid (compound e-1), 0.429 g of 2,6-di-tert-butyl-p-cresol, 0.501 g of benzyltriethylammonium chloride, and 70.9 g of Propylene glycol-1-monomethyl ether-2-acetate and stirred at 120° C. for 16 hours. After cooling to room temperature, 13.0 g of ethyl acetoacetate (hereinafter "compound b-2") and 0.9 g of triethylamine were added, followed by stirring at 92° C. for 8 hours. The reaction mixture was cooled to room temperature, and 15.4 g of succinic anhydride (compound c-1), 1.39 g of tetra-n-butylammonium bromide, and 99.5 g of Propylene glycol-1-monomethyl ether-2-acetate were added, followed by stirring at 100° C. for 5 hours. The reaction mixture was cooled to room temperature to provide alkali developable photosensitive resin composition No. 1-4 as the desired product in the form of a Propylene glycol-1-monomethyl ether-2-acetate solution (Mw: 4310; Mn: 2280; acid value (solid content): 68.8 mg-KOH/g).

The photopolymerizable unsaturated compound (J) contained in alkali developable photosensitive resin composition No. 1-4 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-2 as component (B) to the epoxy adduct in a ratio of 0.67 or fewer hydrogen atoms (of the methylene group located between the keto group and ester group of the β-ketoester group of compound b-2) per acrylate group of the epoxy adduct, and addition of compound c-1 as component (C) to the resulting adduct in a ratio of 0.5 acid anhydride structures (of compound c-1) per hydroxyl group of the adduct.

Example 4-5

Preparation of Alkali Developable Photosensitive Resin Composition No. 1-5

In a reactor were put 84.3 g of bis[4-(2,3-epoxypropoxy)phenyl]-4-biphenylyl(cyclohexyl)methane (compound d-1), 22.1 g of acrylic acid (compound e-1), 0.429 g of 2,6-di-tert-butyl-p-cresol, 0.501 g of benzyltriethylammonium chloride, and 70.9 g of Propylene glycol-1-monomethyl ether-2-acetate and stirred at 120° C. for 16 hours. After cooling to room temperature, 14.2 g of allyl acetoacetate (hereinafter "compound b-3") and 0.9 g of triethylamine were added, followed by stirring at 92° C. for 6 hours. The reaction mixture was cooled to room temperature, and 15.0 g of succinic anhydride (compound c-1), 1.35 g of tetra-n-butylammonium bromide, and 96.9 g of Propylene glycol-1-monomethyl ether-2-acetate were added thereto, followed by stirring at 100° C. for 5 hours. The reaction mixture was cooled to room temperature to provide alkali developable photosensitive resin composition No. 1-5 as the desired product in the form of a Propylene glycol-1-monomethyl ether-2-acetate solution (Mw: 4870; Mn: 2440; acid value (solid content): 66.2 mg-KOH/g).

The photopolymerizable unsaturated compound (J) contained in alkali developable photosensitive resin composition No. 1-5 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-3 as component (B) to the epoxy adduct in a ratio of 0.67 or fewer hydrogen atoms (of the methylene group located between the keto group and ester group of the β-ketoester group of compound b-3) per acrylate group of the epoxy adduct, and addition of compound c-1 as component (C) to the resulting adduct in a ratio of 0.5 acid anhydride structures (of compound c-1) per hydroxyl group of the adduct.

Example 4-6

Preparation of Alkali Developable Photosensitive Resin Composition No. 1-6

In a reactor were put 89.9 g of bis[4-(2,3-epoxypropoxy)phenyl]-4-biphenylyl(cyclohexyl)methane (compound d-1), 23.5 g of acrylic acid (compound e-1), 0.457 g of 2,6-di-tert-butyl-p-cresol, 0.534 g of benzyltriethylammonium chloride, and 75.6 g of Propylene glycol-1-monomethyl ether-2-acetate and stirred at 120° C. for 16 hours. After cooling to room temperature, 12.0 g of 2,4-pentanedione (compound b-1) and 0.97 g of triethylamine were added, followed by stirring at 92° C. for 17 hours. The reaction mixture was cooled to room temperature, and 42.0 g of Propylene glycol-1-monomethyl ether-2-acetate was added. Further, 16.0 g of succinic anhydride (compound c-1) was added, followed by stirring at 100° C. for 5 hours. The reaction mixture was cooled to room temperature, and 55.3 g of Propylene glycol-1-monomethyl ether-2-acetate was added to provide alkali developable photosensitive resin composition No. 1-6 as the desired product in the form of a Propylene glycol-1-monomethyl ether-2-acetate solution (Mw: 4210; Mn: 2630; acid value (solid content): 66.6 mg-KOH/g).

The photopolymerizable unsaturated compound (J) contained in alkali developable photosensitive resin composition No. 1-6 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct in a ratio of 0.75 or fewer hydrogen atoms (of the methylene group located between the two keto groups of the β-diketone moiety of compound b-1) per acrylate group of the epoxy adduct, and addition of compound c-1 as component (C) to the resulting adduct in a ratio of 0.5 acid anhydride structures (of compound c-1) per hydroxyl group of the adduct.

Example 4-7

Preparation of Alkali Developable Photosensitive Resin Composition No. 1-7

In a reactor were put 89.9 g of bis[4-(2,3-epoxypropoxy)phenyl]-4-biphenylyl(cyclohexyl)methane (compound d-1), 23.5 g of acrylic acid (compound e-1), 0.457 g of 2,6-di-tert-butyl-p-cresol, 0.534 g of benzyltriethylammonium chloride, and 75.6 g of Propylene glycol-1-monomethyl ether-2-acetate and stirred at 120° C. for 16 hours. After cooling to room temperature, 12.0 g of 2,4-pentanedione (compound b-1) and 0.97 g of triethylamine were added, followed by stirring at 92° C. for 17 hours. The reaction mixture was cooled to room temperature, and 42.0 g of Propylene glycol-1-monomethyl ether-2-acetate was added. Further, 24.3 g of tetrahydrophthalic anhydride (hereinafter "compound c-2") was added, followed by stirring at 100° C. for 5 hours. The reaction mixture was cooled to room temperature, and 68.5 g of Propylene glycol-1-monomethyl ether-2-acetate was added to provide alkali developable photosensitive resin composition No. 1-7 as the desired product in the form of a Propylene glycol-1-monomethyl ether-2-acetate solution (Mw: 4080; Mn: 2410; acid value (solid content): 62.3 mg-KOH/g).

The photopolymerizable unsaturated compound (J) contained in alkali developable photosensitive resin composition No. 1-7 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct in a ratio of 0.75 or fewer hydrogen atoms (of the methylene group located between the two keto groups of the β-diketone moiety of compound b-1) per acrylate group of the epoxy adduct, and addition of compound c-2 as component (C) to the resulting adduct in a ratio of 0.5 acid anhydride structures (of compound c-2) per hydroxyl group of the adduct.

Example 4-8

Preparation of Alkali Developable Photosensitive Resin Composition No. 1-8

A mixture of 200 g of a phenol-dicyclopentadiene adduct type epoxy compound (HP-7200H from DIC Corp.) (hereinafter "compound d-4"), 53.1 g of acrylic acid (compound e-1), 1.31 g of tetrabutylammonium acetate, 0.698 g of 2,6-di-tert-butyl-p-cresol, and 309 g of Propylene glycol-1-monomethyl ether-2-acetate was stirred at 120° C. for 26 hours. After cooling to room temperature, 21.7 g of 2,4-pentanedione (compound b-1), 1.01 g of benzyltriethylammonium chloride, 0.276 g of 2,6-di-tert-butyl-p-cresol, and 26.5 g of Propylene glycol-1-monomethyl ether-2-acetate were added, followed by stirring at 100° C. for 9 hours. The reaction mixture was cooled to room temperature, and 15.6 g of tetrahydrophthalic anhydride (compound c-2) and 0.206 g of tetra-n-butylammonium bromide were added, followed by stirring at 100° C. for 3 hours. The reaction mixture was cooled to room temperature, and 4.69 g of Propylene glycol-1-monomethyl ether-2-acetate was added to provide alkali developable photosensitive resin composition No. 1-8 as the desired product in the form of a Propylene glycol-1-monom- ethyl ether-2-acetate solution (Mw: 2850; Mn: 1660; acid value (solid content): 48.7 mg-KOH/g).

The photopolymerizable unsaturated compound (J) contained in alkali developable photosensitive resin composition No. 1-8 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct in a ratio of 0.6 or fewer hydrogen atoms (of the methylene group located between the two keto groups of the β-diketone moiety of compound b-1) per acrylate group of the epoxy adduct, and addition of compound c-2 as component (C) to the resulting adduct in a ratio of 0.8 acid anhydride structures (of compound c-2) per hydroxyl group of the adduct.

Example 4-9

Preparation of Alkali Developable Photosensitive Resin Composition No. 1-9

A mixture of 60.0 g of pentaerythritol triacrylate (hereinafter "compound a-1"), 5.01 g of 2,4-pentanedione (compound b-1), 0.323 g of triphenyl phosphine, 0.0647 g of 2,6-di-tert-butyl-p-cresol, and 52.9 g of Propylene glycol-1-monomethyl ether-2-acetate were added, followed by stirring at 100° C. for 9 hours. The reaction mixture was cooled to room temperature, and 18.1 g of tetrahydrophthalic anhydride (compound c-2) and 0.323 g of tetra-n-butylammonium bromide were added, followed by stirring at 100° C. for 3 hours. The reaction mixture was cooled to room temperature, and 29.9 g of Propylene glycol-1-monomethyl ether-2-acetate was added to provide alkali developable photosensitive resin composition No. 1-9 as the desired product in the form of a Propylene glycol-1-monomethyl ether-2-acetate solution (Mw: 1230; Mn: 690; acid value (solid content): 85.8 mg-KOH/g).

The photopolymerizable unsaturated compound (J) contained in alkali developable photosensitive resin composition No. 1-9 is a compound obtained by Michael addition polymerization of compound b-1 as component (B) to compound a-1 as component (A) in a ratio of 0.15 or fewer hydrogen atoms (of the methylene group located between the two keto groups of the β-diketone moiety of compound b-1) per acrylate group of compound a-1 and addition of compound c-2 as component (C) to compound a-1 in a ratio of 0.60 acid anhydride structures (of compound c-2) per hydroxyl group.

Example 4-10

Preparation of Alkali Developable Photosensitive Resin Composition No. 1-10

In a reactor were put 84.3 g of bis[4-(2,3-epoxypropoxy)phenyl]-4-biphenylyl(cyclohexyl)methane (compound d-1), 22.1 g of acrylic acid (compound e-1), 0.429 g of 2,6-di-tert-butyl-p-cresol, 0.501 g of benzyltriethylammonium chloride, and 70.9 g of Propylene glycol-1-monomethyl ether-2-acetate and stirred at 120° C. for 16 hours. After cooling to room temperature, 16.2 g of 1-phenyl-1,3-butanedione (hereinafter "compound b-4") and 0.9 g of triethylamine were added, followed by stirring at 100° C. for 20 hours. After cooling to room temperature, a 97.7 g portion of the reaction mixture was taken out, and 0.7 g of 1,8-diazabicyclo[5.4.0]-7-undecene and 42.36 g of Propylene glycol-1-monomethyl ether-2-acetate were added thereto, followed by stirring at 100° C.

for 17 hours and then at 120° C. for 23 hours. The reaction mixture was cooled to room temperature, and 7.5 g of succinic anhydride (compound c-1), 0.642 g of tetra-n-butylammonium bromide, and 8.58 g of Propylene glycol-1-monomethyl ether-2-acetate were added, and the mixture was stirred at 100° C. for 5 hours. The reaction mixture was cooled to room temperature to provide alkali developable photosensitive resin composition No. 1-10 as the desired product in the form of a Propylene glycol-1-monomethyl ether-2-acetate solution (Mw: 4560; Mn: 2340; acid value (solid content): 66.4 mg-KOH/g).

The photopolymerizable unsaturated compound (J) contained in alkali developable photosensitive resin composition No. 1-10 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-4 as component (B) to the epoxy adduct in a ratio of 0.67 or fewer hydrogen atoms (of the methylene group located between the two keto groups of the β-diketone moiety of compound b-4) per acrylate group of the epoxy adduct, and addition of compound c-1 as component (C) to the resulting adduct in a ratio of 0.5 acid anhydride structures (of compound c-1) per hydroxyl group of the adduct.

Example 4-11

Preparation of Alkali Developable Photosensitive Resin Composition 1-11

In a reactor were put 84.3 g of bis[4-(2,3-epoxypropoxy)phenyl]-4-biphenylyl(cyclohexyl)methane (compound d-1), 22.1 g of acrylic acid (compound e-1), 0.429 g of 2,6-di-tert-butyl-p-cresol, 0.501 g of benzyltriethylammonium chloride, and 70.9 g of Propylene glycol-1-monomethyl ether-2-acetate and stirred at 120° C. for 16 hours. After cooling to room temperature, 16.2 g of 1,3-diphenyl-1,3-propanedione (hereinafter "compound b-5") and 1.4 g of 1,8-diazabicyclo[5.4.0]-7-undecene were added to the reaction mixture, followed by stirring at 100° C. for 3 hours and then at 120° C. for 34 hours. The reaction mixture was cooled to room temperature, and 15.0 g of succinic anhydride (compound c-1), 1.35 g of tetra-n-butylammonium bromide, and 48.9 g of Propylene glycol-1-monomethyl ether-2-acetate were added, followed by stirring at 100° C. for 5 hours. The reaction mixture was cooled to room temperature to provide alkali developable photosensitive resin composition No. 1-11 as the desired product in the form of a Propylene glycol-1-monomethyl ether-2-acetate solution (Mw: 3590; Mn: 2250; acid value (solid content): 61.0 mg-KOH/g).

The photopolymerizable unsaturated compound (J) contained in alkali developable photosensitive resin composition No. 1-11 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-5 as component (B) to the epoxy adduct in a ratio of 0.67 or fewer hydrogen atoms (of the methylene group located between the two keto groups of the β-diketone moiety of compound b-5) per acrylate group of the epoxy adduct, and addition of compound c-1 as component (C) to the resulting adduct in a ratio of 0.5 acid anhydride structures (of compound c-1) per hydroxyl group of the adduct.

Example 4-12

Preparation of Alkali Developable Photosensitive Resin Composition No. 1-12

A mixture of 160 g of 3,4-epoxycyclohexylmethyl-3',4'-epoxycyclohexanecarboxylate (Celloxide 2021, from Daicel Chemical Industries, Ltd.) (hereinafter "compound d-5"), 85.3 g of acrylic acid (compound e-1), 1.83 g of triphenylphosphine, 0.648 g of 2,6-di-tert-butyl-p-cresol, and 288 g of Propylene glycol-1-monomethyl ether-2-acetate was stirred at 120° C. for 17 hours. After cooling to room temperature, 29.6 g of 2,4-pentanedione (compound b-1), 1.90 g of tetra-n-butylammonium chloride, and 0.276 g of 2,6-di-tert-butyl-p-cresol were added to the reaction mixture, followed by stirring at 100° C. for 20 hours. The reaction mixture was cooled to room temperature, and 151 g of tetrahydrophthalic anhydride (compound c-2) and 2.34 g of tetra-n-butylammonium bromide were added, followed by stirring at 100° C. for 3 hours. The reaction mixture was cooled to room temperature, and 48.3 g of Propylene glycol-1-monomethyl ether-2-acetate was added to provide alkali developable photosensitive resin composition No. 1-12 as the desired product in the form of a Propylene glycol-1-monomethyl ether-2-acetate solution (Mw: 1530; Mn: 930; acid value (solid content): 141 mg-KOH/g).

The photopolymerizable unsaturated compound (J) contained in alkali developable photosensitive resin composition No. 1-12 is a compound obtained by addition of compound e-1 as component (E) to compound d-5 as component (D) in a ratio of 1.0 carboxyl group (of compound e-1) per epoxy group (of compound d-5) to make an epoxy adduct as component (A), Michael addition polymerization of compound b-1 as component (B) to the epoxy adduct in a ratio of 0.5 or fewer hydrogen atoms (of the methylene group located between the two keto groups of the β-diketone moiety of compound b-1) per acrylate group of the epoxy adduct, and addition of compound c-2 as component (C) to the resulting adduct in a ratio of 0.8 acid anhydride structures (of compound c-2) per hydroxyl group of the adduct.

Example 4-13

Preparation of Alkali Developable Photosensitive Resin Composition No. 1-13

In a reactor were put 281 g of bis[4-(2,3-epoxypropoxy)phenyl]-4-biphenylyl(cyclohexyl)methane (compound d-1), 72.0 g of acrylic acid (compound e-1), 1.43 g of 2,6-di-tert-butyl-p-cresol, 1.67 g of benzyltriethylammonium chloride, and 235 g of Propylene glycol-1-monomethyl ether-2-acetate and stirred at 120° C. for 16 hours. After cooling to room temperature, 60.0 g of pentaerythritol tetraacrylate (hereinafter "compound a'-1"), 75.0 g of 2,4-pentanedione (compound b-1), and 3.1 g of triethylamine were added, followed by stirring at 92° C. for 17 hours. The reaction mixture was cooled to room temperature, and 70.0 g of succinic anhydride (compound c-1) and 4.35 g of tetra-n-butylammonium bromide were added, followed by stirring at 100° C. for 5 hours. The reaction mixture was cooled to room temperature, and 443 g of Propylene glycol-1-monomethyl ether-2-acetate was added to provide alkali developable photosensitive resin composition No. 1-13 as the desired product in the form of a Propylene glycol-1-monomethyl ether-2-acetate solution (Mw: 3770; Mn: 2300; acid value (solid content): 73 mg-KOH/g).

The photopolymerizable unsaturated compound (J) contained in alkali developable photosensitive resin composition No. 1-13 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct and compound a'-1 as component (A') in a ratio of 0.75 or fewer hydrogen atoms (of the methylene group located between the two keto groups of the β-diketone moiety of compound b-1) per acrylate group (of the mixture of the epoxy adduct and compound a'-1), and addition of compound c-1 as component (C) to the resulting adduct in a ratio of 0.7 acid anhydride structures (of compound c-1) per hydroxyl group.

Example 4-14

Preparation of Alkali Developable Photosensitive Resin Composition No. 1-14

In a reactor were put 232.0 g of 9,9-bis[4-(2,3-epoxypropoxy)phenyl]-9H-fluorene (compound d-2), 72.0 g of acrylic acid (compound e-1), 1.43 g of 2,6-di-tert-butyl-p-cresol, 1.67 g of benzyltriethylammonium chloride, and 203.0 g of Propylene glycol-1-monomethyl ether-2-acetate and stirred at 120° C. for 16 hours. After cooling to room temperature, 75.0 g of 2,4-pentanedione (compound b-1), 88.0 g of pentaerythritol tetraacrylate (compound a'-1), and 3.1 g of triethylamine were added to the reaction mixture, followed by stirring at 92° C. for 17 hours. The reaction mixture was cooled to room temperature, and 70.0 g of succinic anhydride (compound c-1) and 4.35 g of tetra-n-butylammonium bromide were added, followed by stirring at 100° C. for 5 hours.

The reaction mixture was cooled to room temperature, and 415 g of Propylene glycol-1-monomethyl ether-2-acetate was added to provide alkali developable photosensitive resin composition No. 1-14 as the desired product in the form of a Propylene glycol-1-monomethyl ether-2-acetate solution (Mw: 3700; Mn: 2190; acid value (solid content): 79 mg-KOH/g).

The photopolymerizable unsaturated compound (J) contained in alkali developable photosensitive resin composition No. 1-14 is a compound obtained by addition of compound e-1 as component (E) to compound d-2 as component (D) in a ratio of 1.0 carboxyl group (of compound e-1) per epoxy group (of compound d-2) to make an epoxy adduct as component (A), Michael addition polymerization of compound b-1 as component (B) to the epoxy adduct and compound a'-1 as component (A') in a ratio of 0.75 or fewer hydrogen atoms (of the methylene group located between the two keto groups of the β-diketone moiety of compound b-1) per acrylate group (of the mixture of the epoxy adduct and compound a'-1), and addition of compound c-1 as component (C) to the resulting adduct in a ratio of 0.8 acid anhydride structures (of compound c-1) per hydroxyl group.

Example 4-15

Preparation of Alkali Developable Photosensitive Resin Composition No. 1-15

In a reactor were put 281 g of bis[4-(2,3-epoxypropoxy)phenyl]-4-biphenylyl(cyclohexyl)methane (compound d-1), 72.0 g of acrylic acid (compound e-1), 1.43 g of 2,6-di-tert-butyl-p-cresol, 1.67 g of benzyltriethylammonium chloride, and 235 g of Propylene glycol-1-monomethyl ether-2-acetate and stirred at 120° C. for 16 hours. After cooling to room temperature, 74.0 g of trimethylolpropane triacrylate (hereinafter "compound a'-2"), 75.0 g of 2,4-pentanedione (compound b-1), and 3.1 g of triethylamine were added to the reaction mixture, followed by stirring at 92° C. for 17 hours. The reaction mixture was cooled to room temperature, and 70.0 g of succinic anhydride (compound c-1) and 4.35 g of tetra-n-butylammonium bromide were added, followed by stirring at 100° C. for 5 hours. The reaction mixture was cooled to room temperature, and 426 g of Propylene glycol-1-monomethyl ether-2-acetate was added to provide alkali developable photosensitive resin composition No. 1-15 as the desired product in the form of a Propylene glycol-1-monomethyl ether-2-acetate solution (Mw: 3650; Mn: 2220; acid value (solid content): 75 mg-KOH/g).

The photopolymerizable unsaturated compound (J) contained in alkali developable photosensitive resin composition No. 1-15 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct and compound a'-2 as component (A') in a ratio of 0.86 or fewer hydrogen atoms (of the methylene group located between the two keto groups of the β-diketone moiety of compound b-1) per acrylate group (of the mixture of the epoxy adduct and compound a'-2), and addition of compound c-1 as component (C) to the resulting adduct in a ratio of 0.7 acid anhydride structures (of compound c-1) per hydroxyl group.

Example 4-16

Preparation of Alkali Developable Photosensitive Resin Composition No. 1-16

In a reactor were put 281 g of bis[4-(2,3-epoxypropoxy)phenyl]-4-biphenylyl(cyclohexyl)methane (compound d-1), 72.0 g of acrylic acid (compound e-1), 1.43 g of 2,6-di-tert-butyl-p-cresol, 1.67 g of benzyltriethylammonium chloride, and 235 g of Propylene glycol-1-monomethyl ether-2-acetate and stirred at 120° C. for 16 hours. After cooling to room temperature, 145 g of tricyclodecanedimethanol diacrylate (hereinafter "compound a'-3"), 75.0 g of 2,4-pentanedione (compound b-1), and 3.1 g of triethylamine were added to the reaction mixture, followed by stirring at 92° C. for 18 hours. The reaction mixture was cooled to room temperature, and 70.0 g of succinic anhydride (compound c-1) and 4.35 g of tetra-n-butylammonium bromide were added, followed by stirring at 100° C. for 5 hours. The reaction mixture was cooled to room temperature, and 512 g of Propylene glycol-1-monomethyl ether-2-acetate was added to provide alkali developable photosensitive resin composition No. 1-16 as the desired product in the form of a Propylene glycol-1-monomethyl ether-2-acetate solution (Mw: 3780; Mn: 2450; acid value (solid content): 73 mg-KOH/g).

The photopolymerizable unsaturated compound (J) contained in alkali developable photosensitive resin composition No. 1-16 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-1 as component (B) to the epoxy adduct and compound a'-3 as component (A') in a ratio of 0.75 or fewer hydrogen atoms (of the methylene group located between the two keto groups of the β-diketone moiety of compound b-1) per acrylate group (of the mixture of the epoxy adduct and compound a'-3), and addition of compound c-1 as component (C) to the resulting adduct in a ratio of 0.7 acid anhydride structures (of compound c-1) per hydroxyl group.

Example 4-17

Preparation of Alkali Developable Photosensitive Resin Composition No. 1-17

Step 1: Preparation of Epoxy Acrylate Solution A-BC
A mixture of 842.7 g of bis[4-(2,3-epoxypropoxy)phenyl]-4-biphenylyl(cyclohexyl)methane (compound d-1), 220.5 g of acrylic acid (compound e-1), 4.29 g of 2,6-di-tert-butyl-p-cresol, 5.42 g of benzyltriethylammonium chloride, and 708.8 g of Propylene glycol-1-monomethyl ether-2-acetate was stirred at 120° C. for 14 hours, followed by cooling to room temperature to prepare epoxy acrylate solution A-BC.
Step 2: Preparation of Alkali Developable Photosensitive Resin Composition No. 1-17
A mixture of 53.5 g of epoxy acrylate solution A-BC, 6.4 g of 1-(2-naphthyl)butane-1,3-dione (hereinafter "compound b-6"), 0.8 g of 1,8-diazabicyclo[5.4.0]-7-undecene, and 17.9 g of Propylene glycol-1-monomethyl ether-2-acetate was stirred at 120° C. for 4 hours. After cooling to room temperature, 6.8 g of tetrahydrophthalic anhydride (compound c-2) and 6.8 g of Propylene glycol-1-monomethyl ether-2-acetate were added to the reaction mixture, and the mixture was stirred at 100° C. for 5 hours, followed by cooling to room temperature to provide alkali developable photosensitive resin composition No. 1-17 in the form of a Propylene glycol-1-monomethyl ether-2-acetate solution (Mw: 5200; Mn: 2320; acid value: 57.0 mg-KOH/g).
The photopolymerizable unsaturated compound (J) contained in alkali developable photosensitive resin composition No. 1-17 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-6 as component (B) to the epoxy adduct in a ratio of 0.67 hydrogen atoms (of the methylene group located between the two keto groups of the β-diketone moiety of compound b-6) per acrylate group of the epoxy adduct, and addition of compound c-2 as component (C) to the resulting adduct in a ratio of 0.5 acid anhydride structures (of compound c-2) per hydroxyl group of the adduct.

Example 4-18

Preparation of Alkali Developable Photosensitive Resin Composition No. 1-18

A mixture of 19.00 g of epoxy acrylate solution A-BC, 3.32 g of 1-[9-ethyl-6-(4-fluoro-2-methylbenzoyl)-9H-carbazol-3-yl]-butane-1,3-dione (hereinafter "compound b-7"), 0.24 g of 1,8-diazabicyclo[5.4.0]-7-undecene, and 0.64 g of Propylene glycol-1-monomethyl ether-2-acetate was stirred at 120° C. for 12 hours. To the reaction mixture was added 6.73 g of Propylene glycol-1-monomethyl ether-2-acetate. After cooling to room temperature, 2.9 g of succinic anhydride (compound c-1) and 6.9 g of Propylene glycol-1-monomethyl ether-2-acetate were added to the reaction mixture, and the mixture was stirred at 100° C. for 5 hours, followed by cooling to room temperature to provide alkali developable photosensitive resin composition No. 1-18 in the form of a Propylene glycol-1-monomethyl ether-2-acetate solution (Mw: 4430; Mn: 2110; acid value: 96.5 mg-KOH/g).
The photopolymerizable unsaturated compound (J) contained in alkali developable photosensitive resin composition No. 1-18 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-7 as component (B) to the epoxy adduct in a ratio of 0.5 hydrogen atoms (of the methylene group located between the two keto groups of the β-diketone moiety of compound b-7) per acrylate group of the epoxy adduct, and addition of compound c-1 as component (C) to the resulting adduct in a ratio of 0.9 acid anhydride structures (of compound c-1) per hydroxyl group of the adduct.

Example 4-19

Preparation of Alkali Developable Photosensitive Resin Composition No. 1-19

Step 1: Preparation of Epoxy Acrylate Solution
A mixture of 185 g of 2,2-bis[4-(2,3-epoxypropoxy)phenyl]propane (compound d-3), 73.5 g of acrylic acid (compound e-1), 0.7 g of 2,6-di-tert-butyl-p-cresol, 1.7 g of benzyltriethylammonium chloride, and 174.0 g of Propylene glycol-1-monomethyl ether-2-acetate was stirred at 120° C. for 16 hours, followed by cooling to room temperature to prepare an epoxy acrylate solution.
Step 2: Preparation of Alkali Developable Photosensitive Resin Composition No. 1-19
A mixture of 13.93 g of the epoxy acrylate solution prepared in step 1, 3.32 g of 1-[9-ethyl-6-(4-fluoro-2-methylbenzoyl)-9H-carbazol-3-yl]-butane-1,3-dione (compound b-7), 0.24 g of 1,8-diazabicyclo[5.4.0]-7-undecene, and 0.64 g of Propylene glycol-1-monomethyl ether-2-acetate was stirred at 120° C. for 8 hours. To the reaction mixture was added 5.73 g of Propylene glycol-1-monomethyl ether-2-acetate. After cooling to room temperature, 2.9 g of succinic anhydride (compound c-1) and 5.8 g of Propylene glycol-1-monomethyl ether-2-acetate were added thereto, and the mixture was stirred at 100° C. for 5 hours, followed by cooling to room temperature to provide alkali developable photosensitive resin composition No. 1-19 in the form of a Propylene glycol-1-monomethyl ether-2-acetate solution (Mw: 4300; Mn: 2140; acid value: 114.5 mg-KOH/g).
The photopolymerizable unsaturated compound (J) contained in alkali developable photosensitive resin composition No. 1-19 is a compound obtained by addition of compound e-1 as component (E) to compound d-3 as component (D) in a ratio of 1.0 carboxyl group (of compound e-1) per epoxy group (of compound d-3) to make an epoxy adduct as component (A), Michael addition polymerization of compound b-7 as component (B) to the epoxy adduct in a ratio of 0.5 hydrogen atoms (of the methylene group located between the two keto groups of the β-diketone moiety of compound b-7) per acrylate group of the epoxy adduct, and addition of compound c-1 as component (C) to the resulting adduct in a ratio of 0.9 acid anhydride structures (of compound c-1) per hydroxyl group of the adduct.

Example 4-20

Preparation of Alkali Developable Photosensitive Resin Composition No. 1-20

A mixture of 53.5 g of the epoxy acrylate solution A-BC, 8.8 g of 1-(9-propyl-9H-carbazol-3-yl)-butane-1,3-dione (hereinafter "compound b-8"), 0.8 g of 1,8-diazabicyclo[5.4.0]-7-undecene, and 20.3 g of Propylene glycol-1-monomethyl ether-2-acetate was stirred at 120° C. for 13 hours. After cooling to room temperature, 6.8 g of tetrahydrophthalic anhydride (compound c-2) and 17.62 g of Propylene glycol-1-monomethyl ether-2-acetate were added to the reaction mixture, and the mixture was stirred at 100° C. for 5 hours, followed by cooling to room temperature to provide alkali developable photosensitive resin composition No. 1-20 in the form of a Propylene glycol-1-monomethyl ether-2-acetate solution (Mw: 4440; Mn: 2290; acid value: 55.8 mg-KOH/g).

The photopolymerizable unsaturated compound (J) contained in alkali developable photosensitive resin composition No. 1-20 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-8 as component (B) to the epoxy adduct in a ratio of 0.67 hydrogen atoms (of the methylene group located between the two keto groups of the β-diketone moiety of compound b-8) per acrylate group of the epoxy adduct, and addition of compound c-2 as component (C) to the resulting adduct in a ratio of 0.5 acid anhydride structures (of compound c-2) per hydroxyl group of the adduct.

Example 4-21

Preparation of Alkali Developable Photosensitive Resin Composition No. 1-21

A mixture of 35.6 g of epoxy acrylate solution A-BC, 8.31 g of 1-[9-ethyl-6-(4-fluoro-2-methylbenzoyl)-9H-carbazol-3-yl]-butane-1,3-dione (compound b-7), 0.5 g of 1,8-diazabicyclo[5.4.0]-7-undecene, and 16.0 g of Propylene glycol-1-monomethyl ether-2-acetate was stirred at 120° C. for 10 hours. After cooling to room temperature, 6.4 g of tetrahydrophthalic anhydride (compound c-2) and 14.5 g of Propylene glycol-1-monomethyl ether-2-acetate were added to the reaction mixture, and the mixture was stirred at 100° C. for 5 hours, followed by cooling to room temperature to provide alkali developable photosensitive resin composition No. 1-21 in the form of a Propylene glycol-1-monomethyl ether-2-acetate solution (Mw: 4810; Mn: 2190; acid value: 65.9 mg-KOH/g).

The photopolymerizable unsaturated compound (J) contained in alkali developable photosensitive resin composition No. 1-21 is a compound obtained by addition of compound e-1 as component (E) to compound d-1 as component (D) in a ratio of 1.0 carboxyl group (of compound e-1) per epoxy group (of compound d-1) to make an epoxy adduct as component (A), Michael addition polymerization of compound b-7 as component (B) to the epoxy adduct in a ratio of 0.67 hydrogen atoms (of the methylene group located between the two keto groups of the β-diketone moiety of compound b-7) per acrylate group of the epoxy adduct, and addition of compound c-2 as component (C) to the resulting adduct in a ratio of 0.7 acid anhydride structures (of compound c-2) per hydroxyl group of the adduct.

Comparative Example 3-1

Preparation of Comparative Resin Composition No. 1-1

A mixture of 184 g of 9,9-bis[4-(2,3-epoxypropoxy)phenyl]-9H-fluorene (compound d-2), 58.0 g of acrylic acid (compound e-1), 0.26 g of 2,6-di-tert-butyl-p-cresol, 0.11 g of tetra-n-butylammonium bromide, and 23.0 g of Propylene glycol-1-monomethyl ether-2-acetate was stirred at 120° C. for 16 hours. After cooling to room temperature, 35.0 g of Propylene glycol-1-monomethyl ether-2-acetate, 59.0 g of biphthalic anhydride, 20.0 g of tetrahydrophthalic anhydride, and 0.24 g of tetra-n-butylammonium bromide were added to the reaction mixture, followed by stirring at 120° C. for 4 hours, 100° C. for 3 hours, 80° C. for 4 hours, 60° C. for 6 hours, and 40° C. for 11 hours in that order. After cooling to room temperature, 90.0 g of Propylene glycol-1-monomethyl ether-2-acetate was added to provide comparative resin composition No. 1-1 in the form of a Propylene glycol-1-monomethyl ether-2-acetate solution (Mw: 5000; Mn: 2100; acid value (solid content): 93 mg-KOH/g).

Comparative Example 3-2

Preparation of Comparative Resin Composition No. 1-2

A mixture of 154 g of 2,2-bis[4-(2,3-epoxypropoxy)phenyl]propane (compound d-3), 59.0 g of acrylic acid (compound e-1), 0.26 g of 2,6-di-tert-butyl-p-cresol, 0.11 g of tetra-n-butylammonium bromide, and 23.0 g of Propylene glycol-1-monomethyl ether-2-acetate was stirred at 120° C. for 16 hours. After cooling to room temperature, 36.0 g of Propylene glycol-1-monomethyl ether-2-acetate, 67.0 g of biphthalic anhydride, and 0.24 g of tetra-n-butylammonium bromide were added to the reaction mixture, followed by stirring at 120° C. for 4 hours, 100° C. for 3 hours, 80° C. for 4 hours, 60° C. for 6 hours, and 40° C. for 11 hours in that order. After cooling to room temperature, 90.0 g of Propylene glycol-1-monomethyl ether-2-acetate was added to provide comparative resin composition No. 1-2 in the form of a Propylene glycol-1-monomethyl ether-2-acetate solution (Mw: 7500; Mn: 2100; acid value (solid content): 91 mg-KOH/g).

Examples 5-1 to 5-16 and Comparative Examples 4-1 and 4-2

Preparation of Alkali Developable Photosensitive Resin Composition Nos. 2-1 to 2-16 and Comparative Resin Composition Nos. 2-1 and 2-2

A 14 g portion of each of alkali developable photosensitive resin composition Nos. 1-1 through 1-16 obtained in Examples 4-1 through 4-16 and comparative resin composition Nos. 1-1 and 1-2 obtained in Comparative Examples 3-1 and 3-2 was mixed with 5.0 g of pentaerythritol tetraacrylate (compound a'-1) as a monomer having an unsaturated bond and 78 g of Propylene glycol-1-monomethyl ether-2-acetate as a solvent, and the mixture was thoroughly stirred to obtain alkali developable photosensitive resin composition Nos. 2-1 through 2-16 according to the invention and comparative resin composition Nos. 2-1 and 2-2.

Examples 5-17 to 5-21 and Comparative Example 4-3

Preparation of Alkali Developable Photosensitive Resin Composition Nos. 2-17 to 2-21 and Comparative Resin Composition No. 2-3

A 17 g portion of each of alkali developable photosensitive resin composition Nos. 1 to 4 obtained in Examples 1-1 through 1-4 and comparative resin composition No. 2 obtained in Comparative Example 1-2 was mixed with 7.0 g of trimethylolpropane triacrylate (compound a'-2) as a monomer having an unsaturated bond and 78 g of Propylene glycol-1-monomethyl ether-2-acetate as a solvent, and the mixture was thoroughly stirred to obtain alkali developable photosensitive resin composition Nos. 2-17 through 2-21 and comparative resin composition No. 2-3.

Evaluation Examples 2-1 to 2-21 and Comparative Evaluation Examples 2-1 and 2-2

Alkali developable photosensitive resin composition Nos. 2-1 to 2-21 and comparative rein composition Nos. 2-1 to 2-3 prepared in Examples 5-1 to 5-21 and Comparative Examples 4-1 to 4-3 were evaluated as follows.

The composition was applied to a glass substrate by spin coating (700 rpm, 5 seconds), dried in air for 15 minutes, and prebaked on a 90° C. hot plate for 90 seconds. The prebaked coating layer was patternwise exposed to light from a high pressure mercury lamp at a varied exposure through a mask having an opening size of 30 μm, immersed in a 2.5 mass % sodium carbonate solution at 25° C. for 60 seconds (development), and thoroughly washed with water. A composition that formed a pattern by exposure at 100 mJ/cm$^2$ was rated "very good". A composition that was unable to form a pattern at 100 mJ/cm$^2$ but formed a pattern at 150 mJ/cm$^2$ was rated good. A composition that failed to form a pattern even at 150 mJ/cm$^2$ was rated bad. The results are shown in Table 6.

tive Examples 4-1 to 4-3 did not cured without a photopolymerization initiator (F), resulting in a failure to form a pattern by alkali development.

Examples 6-1 to 6-5 and Comparative Example 5

Preparation of Colored Alkali Developable Photosensitive Resin Composition Nos. 1-1 to 1-5 and Comparative Colored Resin Composition No. 1

A 70 g portion of each of alkali developable photosensitive resin composition Nos. 1-17 to 1-21 obtained in Examples 4-17 through 4-21 and comparative resin composition No. 1-2 obtained in Comparative Example 3-2 was mixed with 9.0 g of trimethylolpropane triacrylate (compound a'-2) as a monomer having an unsaturated bond, 30 g of carbon black (MA100, from Mitsubishi Chemical) as a colorant(G), and 75 g of Propylene glycol-1-monomethyl ether-2-acetate as a solvent. The mixture was thoroughly stirred to provide colored alkali developable photosensitive resin composition Nos. 1-1 to 1-5 and comparative colored resin composition No. 1.

Evaluation Examples 3-1 to 3-5 and Comparative Evaluation Example 3

Colored alkali developable photosensitive resin composition Nos. 1-1 to 1-5 prepared in Examples 6-1 to 6-5 and comparative colored rein composition No. 1 prepared in Comparative Example 5 were evaluated as follows.

The composition was applied to a glass substrate by spin coating (700 rpm, 5 seconds), dried in air for 15 minutes, and

TABLE 6

|  | Alkali Developable Photosensitive Resin Composition | Comparative Resin Composition | Pattern Forming Ability |
|---|---|---|---|
| Evaluation Example 2-1 | No. 2-1 |  | good |
| Evaluation Example 2-2 | No. 2-2 |  | good |
| Evaluation Example 2-3 | No. 2-3 |  | good |
| Evaluation Example 2-4 | No. 2-4 |  | good |
| Evaluation Example 2-5 | No. 2-5 |  | good |
| Evaluation Example 2-6 | No. 2-6 |  | good |
| Evaluation Example 2-7 | No. 2-7 |  | good |
| Evaluation Example 2-8 | No. 2-8 |  | good |
| Evaluation Example 2-9 | No. 2-9 |  | good |
| Evaluation Example 2-10 | No. 2-10 |  | good |
| Evaluation Example 2-11 | No. 2-11 |  | good |
| Evaluation Example 2-12 | No. 2-12 |  | good |
| Evaluation Example 2-13 | No. 2-13 |  | good |
| Evaluation Example 2-14 | No. 2-14 |  | good |
| Evaluation Example 2-15 | No. 2-15 |  | good |
| Evaluation Example 2-16 | No. 2-16 |  | good |
| Evaluation Example 2-17 | No. 2-17 |  | good |
| Evaluation Example 2-18 | No. 2-18 |  | very good |
| Evaluation Example 2-19 | No. 2-19 |  | very good |
| Evaluation Example 2-20 | No. 2-20 |  | very good |
| Evaluation Example 2-21 | No. 2-21 |  | very good |
| Comparative Evaluation Example 2-1 |  | No. 2-1 | bad |
| Comparative Evaluation Example 2-2 |  | No. 2-2 | bad |
| Comparative Evaluation Example 2-3 |  | No. 2-3 | bad |

The alkali developable photosensitive resin compositions of Examples 5-1 to 5-21 cured by exposure without the aid of a photopolymerization initiator (F) to form a pattern by alkali development. In contrast, the resin compositions of Comparaprebaked on a 90° C. hot plate for 90 seconds. The prebaked coating layer was patternwise exposed to light from a high pressure mercury lamp at 200 mJ/cm$^2$ through a mask having an opening size of 30 μm, immersed in a 2.5 mass % sodium carbonate solution at 25° C. for 40 seconds (development), and thoroughly washed with water. A composition that formed a pattern was rated good. A composition that failed to form a pattern was rated bad. The results are shown in Table 7.

TABLE 7

|  | Colored Alkali developable photosensitive resin composition | Comparative Colored Resin Composition | Pattern Forming Ability |
|---|---|---|---|
| Evaluation Example 3-1 | No. 1-1 |  | bad |
| Evaluation Example 3-2 | No. 1-2 |  | good |
| Evaluation Example 3-3 | No. 1-3 |  | good |
| Evaluation Example 3-4 | No. 1-4 |  | good |
| Evaluation Example 3-5 | No. 1-5 |  | good |
| Comparative Evaluation Example 3 |  | No. 1 | bad |

The colored alkali developable photosensitive resin compositions of Examples 6-2 to 6-5 cured by exposure without the aid of a photopolymerization initiator to form a pattern by alkali development. In contrast, the resin compositions of Example 6-1 and Comparative Example 5 did not cure without a photopolymerization initiator, resulting in a failure to form a pattern by alkali development.

Examples 7-1 to 7-16 and Comparative Examples 6-1 and 6-2

Preparation of Alkali Developable Photosensitive Resin Composition Nos. 3-1 to 3-16 and Comparative Photosensitive Resin Composition Nos. 1-1 and 1-2

A 14 g portion of each of alkali developable photosensitive resin composition Nos. 1-1 to 1-16 obtained in Examples 4-1 through 4-16 and comparative photosensitive resin composition Nos. 1-1 and 1-2 obtained in Comparative Examples 3-1 and 3-2 was mixed with 6.0 g of trimethylolpropane triacrylate (compound a'-2) as a monomer having an unsaturated bond, 3.0 g of 2,4,6-trimethylbenzoyldiphenylphosphine oxide as a photopolymerization initiator (F), and 78 g of Propylene glycol-1-monomethyl ether-2-acetate as a solvent, and the mixture was thoroughly stirred to obtain alkali developable photosensitive resin composition Nos. 3-1 through 3-16 of the invention and comparative photosensitive resin composition Nos. 1-1 and 1-2.

Evaluation Examples 4-1 to 4-16 and Comparative Evaluation Examples 4-1 and 4-2

Alkali developable photosensitive resin composition Nos. 3-1 to 3-16 and comparative photosensitive rein composition Nos. 1-1 and 1-2 prepared in Examples 7-1 to 7-16 and Comparative Examples 6-1 and 6-2 were evaluated as follows.

A substrate was spin coated with γ-glycidoxypropylmethylethoxysilane, and the coat was thoroughly spin-dried. Each of the photosensitive resin compositions was applied thereon by spin coating (1300 rpm, 50 seconds), dried, and prebaked at 70° C. for 20 minutes. A 5 mass % polyvinyl alcohol solution was applied thereon and dried at 70° C. for 20 minutes to form an oxygen barrier film. The coated substrate was exposed to light from an ultrahigh pressure mercury lamp through a mask with a prescribed pattern, immersed in a 2.5 mass % sodium carbonate solution at 25° C. for 30 seconds (development), thoroughly washed with water, dried, and baked at 230° C. for 1 hour to fix the pattern. The following evaluation was made. The results are shown in Table 8 below.

(1) Sensitivity

A photosensitive composition for which an exposure of 100 mJ/cm$^2$ was sufficient were rated "a". A photosensitive composition for which an exposure of 100 mJ/cm$^2$ was insufficient and which was exposed at 150 mJ/cm$^2$ was rated "b". A photosensitive composition for which an exposure of 150 mJ/cm$^2$ was insufficient and which was exposed at 200 mJ/cm$^2$ was rated "c".

(2) Resolution

A photosensitive composition which succeeded in forming a good pattern with a line width of less than 10 μm was rated "A". A composition which succeeded in forming a good pattern with a line with of 10 to 30 μm was rated "B". A composition which formed a good pattern only with a line width of more than 30 μm was rated "C".

(3) Adhesion

The developed pattern was inspected for peel-off. A sample showing no peel was rated "good", and a sample showing peel of the pattern was rated "poor".

TABLE 8

|  | Alkali Developable Photosensitive Resin Composition | Comparative Photosensitive Resin Composition | Sensitivity | Resolution | Adhesion |
|---|---|---|---|---|---|
| Evaluation Example 4-1 | No. 3-1 |  | a | A | good |
| Evaluation Example 4-2 | No. 3-2 |  | a | A | good |
| Evaluation Example 4-3 | No. 3-3 |  | a | A | good |
| Evaluation Example 4-4 | No. 3-4 |  | a | A | good |
| Evaluation Example 4-5 | No. 3-5 |  | a | A | good |
| Evaluation Example 4-6 | No. 3-6 |  | a | A | good |
| Evaluation Example 4-7 | No. 3-7 |  | a | A | good |
| Evaluation Example 4-8 | No. 3-8 |  | a | A | good |
| Evaluation Example 4-9 | No. 3-9 |  | a | A | good |
| Evaluation Example 4-10 | No. 3-10 |  | a | A | good |
| Evaluation Example 4-11 | No. 3-11 |  | a | A | good |
| Evaluation Example 4-12 | No. 3-12 |  | a | A | good |
| Evaluation Example 4-13 | No. 3-13 |  | a | A | good |

TABLE 8-continued

| | Alkali Developable Photosensitive Resin Composition | Comparative Photosensitive Resin Composition | Sensitivity | Resolution | Adhesion |
|---|---|---|---|---|---|
| Evaluation Example 4-14 | No. 3-14 | | a | A | good |
| Evaluation Example 4-15 | No. 3-15 | | a | A | good |
| Evaluation Example 4-16 | No. 3-16 | | a | A | good |
| Comparative Evaluation Example 4-1 | | No. 1-1 | c | B | poor |
| Comparative Evaluation Example 4-2 | | No. 1-2 | b | C | poor |

The alkali developable photosensitive resin compositions of Examples 7-1 to 7-16 proved to have high sensitivity to achieve high resolution and exhibited good adhesion to a substrate with no peeling. In contrast, the alkali developable photosensitive resin compositions of Comparative Examples 6-1 and 6-2 had low sensitivity and resolution and poor adhesion to a substrate.

Examples 8-1 to 8-16 and Comparative Examples 7-1 and 7-2

Preparation of Colored Alkali Developable Photosensitive Resin Composition Nos. 2-1 to 2-16 and Comparative Colored Resin Composition Nos. 2-1 and 2-2

A 44 g portion of each of alkali developable photosensitive resin composition Nos. 1-1 to 1-16 obtained in Examples 4-1 through 4-16 and comparative resin composition Nos. 1-1 and 1-2 obtained in Comparative Examples 3-1 and 3-2 was mixed with 10.0 g of pentaerythritol tetraacrylate (compound a'-1) as a monomer having an unsaturated bond, 5.0 g of 2-methyl-1-(4-methylthiophenyl)-2-morpholinopropan-1-one (Irg907) as a photopolymerization initiator (F), 19 g of carbon black (MA100, from Mitsubishi Chemical) as a colorant (G), and 75 g of Propylene glycol-1-monomethyl ether-2-acetate as a solvent, and the mixture was thoroughly stirred to provide colored alkali developable photosensitive resin composition Nos. 2-1 to 2-16 and comparative colored resin composition Nos. 2-1 and 2-2.

Examples 8-17 to 8-21 and Comparative Example 7-3

Preparation of Colored Alkali Developable Photosensitive Resin Composition Nos. 2-17 to 2-21 and Comparative Colored Resin Composition No. 2-3

A 70 g portion of each of alkali developable photosensitive resin composition Nos. 1-17 to 1-21 obtained in Examples 4-17 through 4-21 and comparative resin composition No. 1-2 obtained in Comparative Example 3-2 was mixed with 9.0 g of trimethylolpropane triacrylate (compound a'-2) as a monomer having an unsaturated bond, 3 g of Irgacure OXE02 (from Ciba Specialties Chemicals) as a photopolymerization initiator (F), 30 g of carbon black (MA100, from Mitsubishi Chemical) as a colorant (G), and 75 g of Propylene glycol-1-monomethyl ether-2-acetate as a solvent, and the mixture was thoroughly stirred to provide colored alkali developable photosensitive resin composition Nos. 2-17 to 2-21 and comparative colored resin composition No. 2-3.

Evaluation Examples 5-1 to 5-21 and Comparative Evaluation Examples 5-1 to 5-3

Colored alkali developable photosensitive resin composition Nos. 2-1 to 2-21 prepared in Examples 8-1 to 8-21 and comparative colored resin composition Nos. 2-1 to 2-3 prepared in Comparative Examples 7-1 to 7-3 were evaluated as follows.

Each of the compositions was applied to a glass substrate by spin coating (700 rpm, 5 seconds), dried in air for 15 minutes, and prebaked on a 90° C. hot plate for 90 seconds. The prebaked coating layer was exposed to light from a high pressure mercury lamp through a prescribed mask, immersed in a 2.5 mass % sodium carbonate solution at 25° C. for 40 seconds (development), thoroughly washed with water, dried, and baked at 230° C. for 1 hour to fix the pattern. The resulting pattern was evaluated as follows. The results obtained are shown in Table 9.

(1) Sensitivity

A photosensitive composition for which an exposure of 50 mJ/cm$^2$ was sufficient was rated "a". A photosensitive composition for which an exposure of 50 mJ/cm$^2$ was insufficient and which was exposed at 70 mJ/cm$^2$ was rated "b". A photosensitive composition for which an exposure of 70 mJ/cm$^2$ was insufficient and which was exposed at 100 mJ/cm$^2$ was rated "c". A photosensitive composition for which an exposure of 100 mJ/cm$^2$ was insufficient and which was exposed at 150 mJ/cm$^2$ was rated "d".

(2) Resolution

A photosensitive composition which succeeded in forming a good pattern with a line width of 5 μm or even smaller was rated "A". A composition which succeeded in forming a good pattern with a line with of 20 μm was rated "B". A composition which formed a good pattern only with a line width of 30 μm or more was rated "C".

(3) Adhesion

The developed pattern was inspected for peel-off. A sample showing no peel was rated "A", and a sample showing partial peel of the pattern was rated "B". A sample showing peel all over the pattern was rated "C".

TABLE 9

| | Colored Alkali Developable Photosensitive Resin Composition | Comparative Colored Resin Composition | Sensitivity | Resolution | Adhesion |
|---|---|---|---|---|---|
| Evaluation Example 5-1 | No. 2-1 | | b | B | B |
| Evaluation Example 5-2 | No. 2-2 | | b | B | B |
| Evaluation Example 5-3 | No. 2-3 | | b | B | B |
| Evaluation Example 5-4 | No. 2-4 | | b | B | B |
| Evaluation Example 5-5 | No. 2-5 | | b | B | B |
| Evaluation Example 5-6 | No. 2-6 | | b | B | B |
| Evaluation Example 5-7 | No. 2-7 | | b | B | B |
| Evaluation Example 5-8 | No. 2-8 | | b | B | B |
| Evaluation Example 5-9 | No. 2-9 | | b | B | B |
| Evaluation Example 5-10 | No. 2-10 | | b | B | B |
| Evaluation Example 5-11 | No. 2-11 | | b | B | B |
| Evaluation Example 5-12 | No. 2-12 | | b | B | B |
| Evaluation Example 5-13 | No. 2-13 | | b | B | B |
| Evaluation Example 5-14 | No. 2-14 | | b | B | B |
| Evaluation Example 5-15 | No. 2-15 | | b | B | B |
| Evaluation Example 5-16 | No. 2-16 | | b | B | B |
| Evaluation Example 5-17 | No. 2-17 | | b | B | B |
| Evaluation Example 5-18 | No. 2-18 | | a | A | A |
| Evaluation Example 5-19 | No. 2-19 | | a | A | A |
| Evaluation Example 5-20 | No. 2-20 | | a | A | A |
| Evaluation Example 5-21 | No. 2-21 | | a | A | A |
| Comparative Evaluation Example 5-1 | | No. 2-1 | d | B | C |
| Comparative Evaluation Example 5-2 | | No. 2-2 | c | C | C |
| Comparative Evaluation Example 5-3 | | No. 2-3 | d | C | C |

The colored alkali developable photosensitive resin compositions of Examples 8-1 to 8-21 proved to have high sensitivity to achieve high resolution and exhibited good adhesion to a substrate with no peeling. In contrast, the comparative colored resin compositions of Comparative Examples 7-1 to 7-3 had low sensitivity and resolution and poor adhesion to a substrate.

INDUSTRIAL APPLICABILITY

The alkali developable photosensitive resin composition of the invention exhibits sufficient sensitivity to give high resolution with no or a reduced amount of a photopolymerization initiator and also exhibits good adhesion.

The invention claimed is:

1. An alkali developable photosensitive resin composition, comprising a photopolymerizable unsaturated compound having a structure resulting from:
   an addition reaction of a compound having a β-diketone moiety or a compound having a β-ketoester group,
   to a (meth)acryloyl group of a compound having at least two (meth)acryloyl groups and a hydroxyl group, and
   subsequent esterification of the hydroxyl group of the resulting addition product with a polybasic acid anhydride, wherein the compound having a β-diketone moiety is represented by general formula (I):

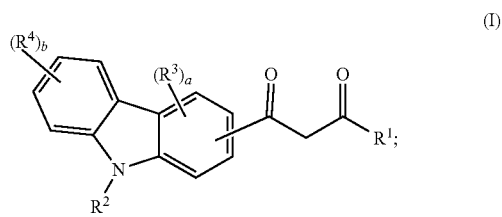

(I)

$R^1$ represents an alkyl group having 1 to 20 carbon atoms;
$R^2$ represents $R^{11}$, $OR^{11}$, $COR^{11}$, $SR^{11}$, $CONR^{12}R^{13}$, or CN;
$R^{11}$, $R^{12}$, and $R^{13}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms, in which said alkyl group, aryl group, arylalkyl group, and heterocyclic group may have a hydrogen atom substituted with $OR^{21}$, $COR^{21}$, $SR^{21}$, $NR^{22}R^{23}$, $CONR^{22}R^{23}$, $-NR^{22}-OR^{23}$, $-NCOR^{22}-OCOR^{23}$, $-C(=N-OR^{21})-R^{22}$, $-C(=N-OCOR^{21})-R^{22}$, CN, a halogen atom, $-CR^{21}=CR^{22}R^{23}$, $-CO-CR^{21}=CR^{22}R^{23}$, a carboxyl group, or an epoxy group;
$R^{21}$, $R^{22}$, and $R^{23}$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 2 to 20 carbon atoms;

methylene units of an alkylene moiety of the substituents represented by $R^{11}$, $R^{12}$, $R^{13}$, $R^{21}$, $R^{22}$, and $R^{23}$ may be interrupted by an unsaturated linkage, an ether linkage, a thioether linkage, an ester linkage, a thioester linkage, an amido linkage, or a urethane linkage at 1 to 5 sites thereof;

an alkyl moiety of the substituents represented by $R^{11}$, $R^{12}$, $R^{13}$, $R^{21}$, $R^{22}$, and $R^{23}$ may be branched or cyclic;

an alkyl terminal of the substituents represented by $R^{11}$, $R^{12}$, $R^{13}$, $R^{21}$, $R^{22}$, and $R^{23}$ may have an unsaturated bond;

$R^{12}$ and $R^{13}$, and $R^{22}$ and $R^{23}$ may be connected to each other to form a ring;

$R^2$ may be taken together with a neighboring benzene ring to form a ring;

$R^3$ and $R^4$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $OCSR^{11}$, $COSR^{11}$, $CSOR^{11}$, CN, a halogen atom, a nitro group, or a hydroxyl group;

a represents an integer of 0 to 3;

b represents an integer of 0 to 4;

when a or b is 2 or greater, then $R^3$s or $R^4$s may be the same or different; and the β-diketone moiety may have either a keto-form or an enol-form.

2. The alkali developable photosensitive resin composition according to claim 1, wherein $R^1$ is a methyl group, and a is 0.

3. The alkali developable photosensitive resin composition according to claim 2, wherein the compound having at least two (meth)acryloyl groups and a hydroxyl group has a structure of a reaction product resulting from the addition of an unsaturated monobasic acid to an epoxy compound.

4. The alkali developable photosensitive resin composition according to claim 2, further comprising a photopolymerization initiator.

5. The alkali developable photosensitive resin composition according to claim 1, wherein $R^1$ is a methyl group, $R^4$ is an optionally halogen-substituted acyl group having 6 to 20 carbon atoms, a is 0, and b is 0 or 1.

6. The alkali developable photosensitive resin composition according to claim 5, wherein the compound having at least two (meth)acryloyl groups and a hydroxyl group has a structure of a reaction product resulting from the addition of an unsaturated monobasic acid to an epoxy compound.

7. The alkali developable photosensitive resin composition according to claim 5, further comprising a photopolymerization initiator.

8. The alkali developable photosensitive resin composition according to claim 1, further comprising a photopolymerization initiator.

9. The alkali developable photosensitive resin composition according to claim 1, further comprising a colorant.

10. The alkali developable photosensitive resin composition according to claim 1, wherein the compound having at least two (meth)acryloyl groups and a hydroxyl group has a structure of a reaction product resulting from the addition of an unsaturated monobasic acid to an epoxy compound.

11. The alkali developable photosensitive resin composition according to claim 1, wherein the epoxy compound is represented by general formula (II):

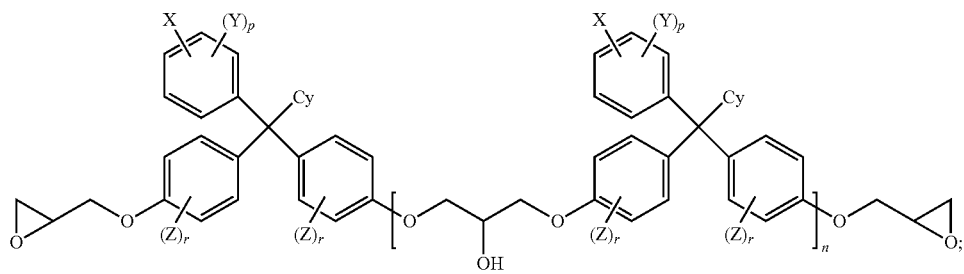

(II)

Cy represents a cycloalkyl group having 3 to 10 carbon atoms;

X represents a hydrogen atom, a phenyl group, or a cycloalkyl group having 3 to 10 carbon atoms, in which the phenyl group and the cycloalkyl group may be substituted with an alkyl group having 1 to 10 carbon atoms, an alkoxy group having 1 to 10 carbon atoms, or a halogen atom;

Y and Z each independently represent an alkyl group having 1 to 10 carbon atoms, an alkoxy group having 1 to 10 carbon atoms, an alkenyl group having 2 to 10 carbon atoms, or a halogen atom, in which the alkyl, alkoxy and alkenyl groups may be substituted with a halogen atom;

n represents an integer of 0 to 10; and p and r each independently represent an integer of 0 to 4.

12. An alkali developable photosensitive resin composition, comprising a photopolymerizable unsaturated compound having a structure resulting from:

an addition reaction of a compound having a β-diketone moiety or a compound having a β-ketoester group, to a (meth)acryloyl group of a compound having at least two (meth)acryloyl groups and a hydroxyl group, and subsequent esterification of the hydroxyl group of the resulting addition product with a polybasic acid anhydride, wherein the compound having at least two (meth)acryloyl groups and a hydroxyl group has a structure of a reaction product resulting from the addition of an unsaturated monobasic acid to an epoxy compound.

13. The alkali developable photosensitive resin composition according to claim 12, wherein the epoxy compound is represented by general formula (II):

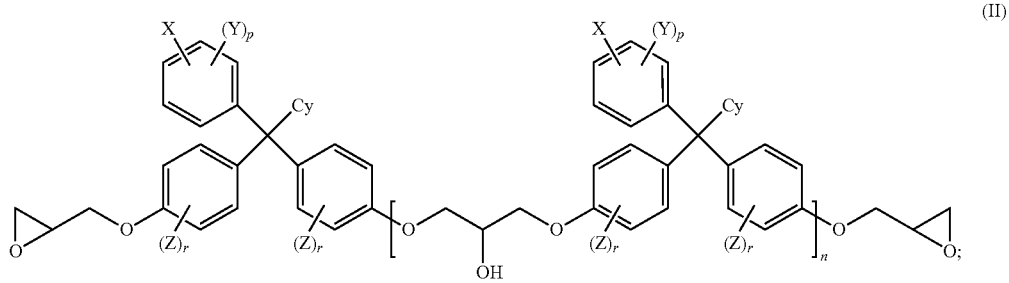

Cy represents a cycloalkyl group having 3 to 10 carbon atoms;

X represents a hydrogen atom, a phenyl group, or a cycloalkyl group having 3 to 10 carbon atoms, in which the phenyl group and the cycloalkyl group may be substituted with an alkyl group having 1 to 10 carbon atoms, an alkoxy group having 1 to 10 carbon atoms, or a halogen atom;

Y and Z each independently represent an alkyl group having 1 to 10 carbon atoms, an alkoxy group having 1 to 10 carbon atoms, an alkenyl group having 2 to 10 carbon atoms, or a halogen atom, in which the alkyl, alkoxy and alkenyl groups may be substituted with a halogen atom;

n represents an integer of 0 to 10; and p and r each independently represent an integer of 0 to 4.

14. The alkali developable photosensitive resin composition according to claim 13, wherein
Cy is a cyclohexyl group;
X is a phenyl group, and
p and r are each 0.

15. The alkali developable photosensitive resin composition according to claim 14, further comprising a photopolymerization initiator.

16. The alkali developable photosensitive resin composition according to claim 13, further comprising a photopolymerization initiator.

17. The alkali developable photosensitive resin composition according to claim 12, further comprising a photopolymerization initiator.

* * * * *